(12) United States Patent
Herrera et al.

(10) Patent No.: US 6,494,999 B1
(45) Date of Patent: Dec. 17, 2002

(54) MAGNETRON SPUTTERING APPARATUS WITH AN INTEGRAL COOLING AND PRESSURE RELIEVING CATHODE

(75) Inventors: Manuel J. Herrera, Cupertino, CA (US); Philip G. Pitcher, Spokane, WA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/708,735

(22) Filed: Nov. 9, 2000

(51) Int. Cl.[7] .................... C23C 14/35; C23C 14/34
(52) U.S. Cl. .................... 204/192.12; 204/298.09; 204/298.12; 204/298.17; 204/298.2
(58) Field of Search .................... 204/192.12, 298.09, 204/298.12, 298.17, 298.2, 298.37

(56) References Cited

U.S. PATENT DOCUMENTS

| 5,178,739 A | 1/1993 | Barnes et al. | 204/192.12 |
|---|---|---|---|
| 5,433,835 A | 7/1995 | Demaray et al. | 204/298.09 |
| 5,487,822 A | 1/1996 | Demaray et al. | 204/298.09 |
| 5,565,071 A | 10/1996 | Demaray et al. | 204/192.12 |
| 5,603,816 A | 2/1997 | Demaray et al. | 204/298.07 |
| 5,676,803 A | 10/1997 | Demaray et al. | 204/192.12 |
| 5,799,860 A | 9/1998 | Demaray et al. | 228/194 |
| 5,876,573 A | 3/1999 | Moslehi et al. | 204/192.12 |
| 5,948,215 A | 9/1999 | Lantsman | 204/192.12 |

FOREIGN PATENT DOCUMENTS

| WO | WO 98/02597 | 1/1998 |
|---|---|---|

*Primary Examiner*—Steven H. VerSteeg
(74) *Attorney, Agent, or Firm*—Wells St. John P.S.

(57) ABSTRACT

A sputtering apparatus includes a sputtering process chamber, a sputtering target assembly, and an adjustable magnetron assembly. The sputtering target assembly includes heating/cooling passages within the sputtering target assembly. A first side of a heat exchanger/pressure relieving plate is attached to a target backing. A second or opposing side of the heat exchanger/pressure relieving plate is attached to an insulation cover to form, within the sputtering target assembly, pressure relieving vacuum passages. The target assembly completely covers and seals against a high-vacuum-compatible insulator resting over and sealed to a top flange of the process chamber. A magnetron assembly resting over the target assembly, is independent from vacuum, or vacuum components, and provides means to move or scan a magnetron or magnet array over the target assembly. The distance between the magnetron and target assembly is adjustable throughout the useful life of the target independent from vacuum, or vacuum components.

31 Claims, 15 Drawing Sheets

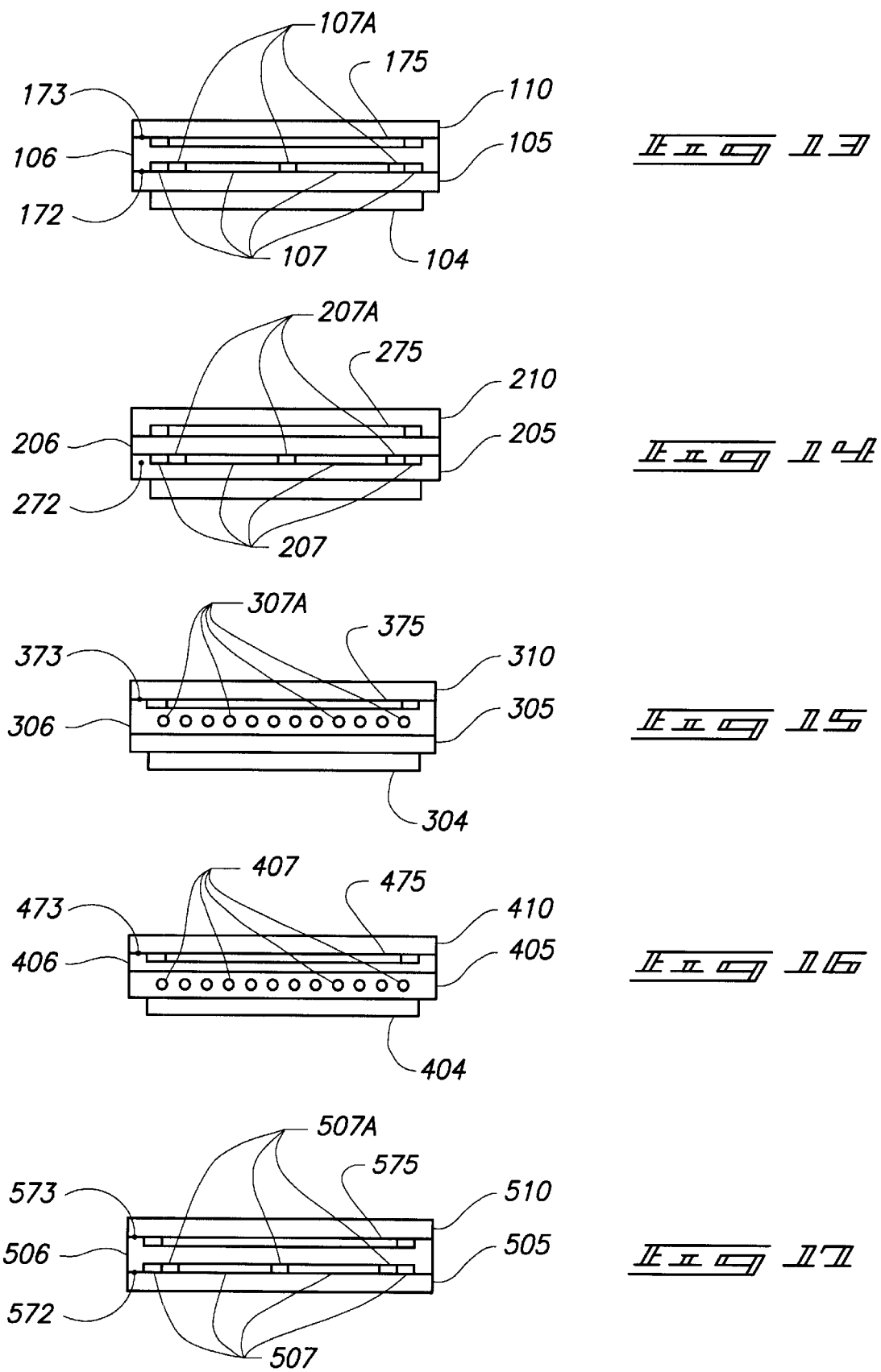

MAGNETRON SPUTTERING APPARATUS WITH AN INTEGRAL COOLING AND PRESSURE RELIEVING CATHODE

FIELD OF THE INVENTION

This invention relates to a magnetron sputtering apparatus employing a thin integral cooling and pressure relieving sputtering cathode, and an adjustable magnetron drive mechanism that allows for plasma/erosion pattern optimization throughout the useful life of the target.

BACKGROUND OF THE INVENTION

One of the most important commercial processes for depositing thin films of a desired material onto a substrate is sputter deposition, also known as sputter coating or sputtering. Sputter deposition is used extensively in many industries including the microelectronics, data storage and display industries to name but a few.

Generally, the term sputtering refers to an "atomistic" process in which neutral, or charged, particles (atoms or molecules) are ejected from the surface of a target material through bombardment with energetic particles. A portion of the sputtered particles condenses onto a substrate to form a thin film. The science and technology of sputtering is well known and described for example in Vossen, J. L., Kern, W., Thin Film Processes, Academic Press (1978). Sputtering can be achieved through several techniques. Generally, in "cathodic" ("diode") sputtering the target is at a high negative potential relative to other components, usually through application of a negative bias from a power supply, in a vacuum chamber system, typically containing an inert gas or mixture of gases at low pressure. A plasma containing ionized gas particles is established close to the target surface and ionized gas particles are accelerated by the action of the electric field towards the target surface. The bombarding particles lose kinetic energy through momentum exchange processes with the target atoms, some of the latter particles gain sufficient "reverse" momentum to escape the body of the target, to become sputtered target particles. Note a sputtered particle may be an atom, atom cluster or molecule either in an electrically neutral or charged state. A flux of sputtered particles may contain any one or any mixture of such entities.

Coating high aspect ratio structures is of critical importance, e.g., in emerging submicron semiconductor interconnect metalization and high density data storage media applications. In such cases the bounds of application of magnetron sputter deposition is approaching its limit. For example, in coating via type structures in microelectronics interconnect applications, it is well known that sputter deposition suffers from film buildout at the upper edges of the via resulting in a trapped void, "keyhole" type film defect as well as other film defects. See, for example, Rossnagel, S., J.Vac. Sci. Tech.B., Vol.16, No.5, p. 2585 (1998). This effect is exasperated with reducing dimensionality and increased aspect ratio. Proponents of current commercial PVD processes assert they can conformally cover relatively high aspect ratio features, or fill relatively high aspect ratio channels or vias, having a critical dimension of at least 0.18 micron, or perhaps greater than 0.13 micron.

Several sputter PVD techniques, many of them developed commercially relatively recently, attempt to control the directionality of the incident sputtered particle flux at a substrate e.g., physical collimation techniques, hollow cathode sputtering, arc sputtering, self ionized sputtering, ionized physical vapor deposition (IPVD) and long throw methods. The latter two techniques probably represent state of the art commercial technologies. The scope, scalability, efficiency and cost considerations of directional sputter technologies have been reviewed by Rossnagel, S., J.Vac. Sci. Tech.B., Vol.16, No.5, p. 2585 (1998). The best techniques utilize tooling and/or process attributes to achieve a degree of control over the angular distribution of incident sputtered particles. These methods are in fact expressly designed to overcome what are believed to be inherent deficiencies in basic magnetron cathode sputter deposition characteristics and target materials design which limit control of the substrate incident angular sputtered flux distribution.

U.S. Pat. No. 5,948,215; U.S. Pat. No. 5,178,739; and Patent Cooperation Treaty published application No. WO 98/48444 disclose ionized plasma vapor deposition processes, and are incorporated herein by reference.

Long throw methods utilize ballistic (i.e., collisionless) transport and a long throw path to the substrate to "optically" filter the magnetron cathode emitted flux such that only relatively low angle components of the emitted flux (i.e., those close to the target normal) are incident at the substrate. The long throw process is clearly inefficient through flux dilution and suffers from inherent asymmetries in the incident flux. See Rossnagel, S., J. Vac. Sci. Tech. B., Vol.16, No.5, p. 2585 (1998).

Planar Magnetron Sputtering apparatuses are well known Physical Vapor Deposition (PVD) tools commonly used in, for example, the semiconductor industry for the deposition of thin films of metals such as aluminum and its alloys, refractory metals, and ceramics onto a substrate; for example, a silicon wafer or glass sheet being processed. In general, the process of Planar Magnetron Sputtering involves creating and confining a plasma of ionized inert gas over the consumable surface of an energized Cathode Assembly in order to dislodge, by momentum transfer, atoms or molecules from the consumable surface. The consumable surface of a cathode assembly consists of the material to be sputtered and is commonly called a sputter "target" in Industry. The target is placed a relatively short distance from the substrate in order to improve collection of the ejected target atoms onto the substrate.

Initially, a discharge caused by primarily electrons emitted from the surface of the target, produced by gas ion bombardment of the target resulting from ionization of the gas by natural background ionizing radiation, strike or ignite the plasma. The target is energized by an applied electric field (DC, RF, or both) in an evacuated chamber that is backfilled with an inert gas to typically the $10^{-4}$–$10^{-1}$ millitorr pressure range. Then, both electrons emitted by the target surface and electrons created by ionizing impacts with the inert gas will be confined near the target surface by means of the magnetron's magnetic field; which is applied crosswise to the electric field. The created ions accelerate towards the surface of the target and dislodge atoms or molecules from it; many of these atoms or molecules will be directed towards the substrate creating a thin film onto the substrate.

It is well known, that maximum erosion of a target occurs where lines of magnetic flux are parallel to the consumable surface of the target. To increase the sputter-deposition rate for a given applied electric field to the cathode, the magnetron should also ride as close as possible to the side opposite to the consumable surface of the target such that the intensity of the parallel component of magnetic field lines above the target is maximized. Therefore, a design goal is to design a target assembly with as thin a cross-section as possible.

In addition, film-properties, for example uniformity on the substrate, depend greatly on the uniformity of erosion of the target; therefore, other design goals are to design a magnetron that can produce a uniform plasma intensity, and design a drive mechanism that can sweep the magnetron uniformly over the entire target surface.

As the magnetron is swept over the target, considerable energy is dissipated in the form of heat by the ions striking the surface of the target; therefore, the target must be cooled in order to avoid melting the cathode assembly or damaging the equipment. The target in the cathode assembly is normally mounted over a backing plate and cooling means provided to it.

The target assembly in a magnetron sputtering device is generally placed over a sputtering opening of a process chamber to seal the process chamber such that it can be evacuated and then maintained at the low pressures required for the sputter process. The large forces acting on the target assembly due to the pressure differential between ambient atmospheric pressure and the vacuum inside the process chamber require that the target assembly, in particular the backing plate, be designed of considerable thickness to overcome the resultant bending forces. Earlier prior art cathodes were also designed to overcome the bending forces produced by coolants impinging onto the backing plate.

As demand for processing larger substrates continues, and the size of the cathode assembly is scaled accordingly, prior art solved the target assembly bending problems associated with coolants impinging on one side of the backing plate by fitting the target assembly with internal cooling channels.

More recently, prior art has solved the target assembly pressure differential problems associated with applying vacuum from only the process chamber side by evacuating the magnetron housing enclosure which is normally mounted over the target assembly.

FIG. 1 is a simple representation of a sputtering device, shown in U.S. Pat. No. 5,433,835, showing a processing chamber 1 that encloses a substrate 5 to be sputter coated. The substrate 5 is surrounded by a dark space or deposition shield 4 to prevent deposition of material from beyond the edge of the target. A lower insulating ring 2 rests on the top flange of the processing chamber 1. A laminated target assembly 8 is-located on the lower insulating ring 2. Inlet and outlet cooling lines 3,9 provide coolant to the internal cooling channels of target assembly 8. An upper insulating ring 7 insulates the top chamber 6 from the target assembly 8. Top chamber 6 is evacuated to equalize the vacuum forces exerted on target assembly 8 by processing chamber 1.

The above mentioned reference, and related U.S. Pat. Nos. 5,487,822 (Jan. 30, 1996), U.S. Pat. No. 5,565,071 (Oct. 15, 1996), U.S. Pat. No. 5,595,337 (Jan. 21, 1997), U.S. Pat. No. 5,603,816 (Feb. 18, 1997), U.S. Pat. No. 5,676,803 (Oct. 14, 1997), U.S. Pat. No. 5,799,860 (Sep. 1, 1998) solved cooling and pressure differential problems by providing internal cooling channels to the target assembly 8 and fitting a top vacuum chamber 6 over it to essentially equalize the forces imparted by the process vacuum chamber 1; however, the techniques employed introduced several disadvantages.

Main disadvantages are:
The top chamber 6 has to be designed rigid enough to overcome the vacuum forces; therefore introducing design complexity and cost,
The magnetron drive (not shown in FIG. 1) resides inside the top chamber 6; therefore, several vacuum seals must be provided to couple the drive components inside the top chamber 6 to the external components that energize them.

Any maintenance or service to the magnetron-drive mechanism, enclosed by top chamber 6, requires that the whole system be brought to atmosphere in order to avoid bending the now thinly designed target assembly; resulting in increased downtime for the tool.

In order to reduce costs, the same pump is generally used to evacuate or rough both the process vacuum chamber 1 and the top chamber 6. In such case, lubrication to the magnetron drive inside the top chamber 6 needs to be vacuum compatible in order to avoid contaminating the rough pump and high-vacuum components. Vacuum-compatible lubricants are generally more expensive and their lubricating properties normally inferior to standard lubricants.

FIG. 2 shows a detail cross-sectional view of an embodiment of U.S. Pat. No. 5,876,573, a more recent prior art design-variation that also addresses the problems of cooling and pressure differential associated with large target assemblies that seal to the opening of a process chamber; however, at the expense of yet considerable design complexity, as will be explained shortly.

According to this embodiment, a magnetron sputtering system 10 is used to perform sputtering of a target material from a target onto a substrate. The target 16 is mounted to a backing plate 18 that includes several internal cooling conduits 19, the assembly is positioned within a vacuum (processing) chamber 11 defined by chamber walls 39, and held in place by retainer ring 13 which is coupled to bearing support 36. A coolant manifold 12 connects to cooling conduits 19 on the backing plate 18, and to several conduit tubes 40 attached to coolant manifold 12. The conduit tubes 40; which also energize the backing plate 18 and target 16, extend through magnetron assembly housing 21, third insulator ring 35, and bearing support 36 as shown in FIG. 2.

Insulating jacket 34 electrically insulates conduit 40 from magnetron assembly housing 21. A magnet array 15 is positioned above backing plate 18, and enclosed by magnetron assembly housing 21, which provides a housing for the entire magnetron assembly 24, and sits on top of chamber 11.

The magnetron assembly housing 21 is formed to enclose the magnet array 15 and form a space, on the magnet array chamber 22, within the magnetron assembly housing 21. Magnet array chamber 22 comprises a space within magnetron assembly 24 that lies above backing plate 18. In operation, the pressure within the magnet array chamber 22 can be reduced to a pressure much lower than atmospheric by operating a pump through pump port 20 that connects to magnet array chamber 22.

U.S. Pat. No. 5,876,573 seems to retain all of the above-mentioned disadvantages of U.S. Pat. No. 5,433,835; that is:
The magnetron assembly housing 21 has to be designed to withstand the vacuum forces,
Driving the magnet array 22 requires vacuum seals to couple to the motor 38, e.g. ferrofluidic feed-thru 27, etc.
Any service to components enclosed by magnetron assembly housing 21 require that the whole system be brought to atmosphere in order to avoid bending the now thinly designed backing plate 18.
Lubricants used (to extend the life of the bearing) with the KAYDON (Kaydon Corp., Muskegon, Mich.) bearing enclosed by magnetron assembly housing 21 should be vacuum compatible if the pump port 20 is in communication with the (processing) chamber 11; else, an additional pump should be dedicated to evacuate the magnet array chamber 22.

Energized conduit tubes 40 extending through magnetron assembly housing 21, third insulator ring 35, bearing support 36, and mating with coolant manifold 12 need to be kept at atmosphere, as shown by the enclosing sealing devices. These additional sealing devices are required to avoid arcing or glow discharging from the energized conduit tubes 40; which would be the case if conduit tubes 40 were to be exposed to the evacuated magnet array chamber 22.

Additionally, as it has been shown without electrical insulation in U.S. Pat. No. 5,876,573, the exposed to vacuum surfaces of a once energized backing plate 18 within magnet array chamber 22 would very likely either arc to the magnet array 15 or produce a parasitic glow discharge in the evacuated magnet array chamber 22.

The disadvantages of the existing sputtering target systems as described above continue to inhibit the wide use of sputtering as an efficient and cost-effective means for applying surface coatings, particularly to large area substrates.

SUMMARY OF THE INVENTION

This invention relates to an improved configuration for a high productivity sputtering device including a target or cathode assembly which has a thin integral cooling and pressure relieving structure, and an adjustable magnetron drive mechanism that can be maintained or serviced without affecting the vacuum components, or the vacuum integrity within the target assembly and process chamber. This configuration overcomes many of the drawbacks of the previous configurations and provides a structure and method to improve sputtering coverage of large-area substrates.

In particular, the present invention provides a sputtering apparatus comprising a sputtering target assembly comprising:

a sputtering target and target backing plate assembly having opposed first and second sides, the first side providing material for sputtering, a pressure relief plate having opposed first and second sides, the target and target backing plate assembly second side being in contact with the first side of the pressure relief plate;

heat exchange passages selected from at least one member of the group consisting of:

heat exchange passages defined between the opposed sides of the sputtering target and backing plate assembly or between the opposed sides of the pressure relief plate, and heat exchange passages defined by heat exchange cavities formed in at least one member of the group consisting of the first side of the pressure relief plate and the second side of the target and target backing plate assembly, wherein the heat exchange passages are formed between the first side of the pressure relief plate and the second side of the target and target backing plate assembly which enclose the heat exchange cavities, the heat exchange passages having one or more inlet and outlet openings;

an insulation cover unit having opposed first and second sides;

wherein the second side of the pressure relief plate is in contact with the first side of the insulation cover unit to form a vacuum pressure space therebetween capable of maintaining a vacuum therein and the vacuum pressure space has one or more vacuum ports.

Typically, the heat exchange passages are defined by having heat exchange cavities formed in the first side of the pressure relief plate such that, when the first side of the pressure relief plate is contacted to the second side of the target and target backing plate assembly, the heat exchange passages are formed between the heat exchange cavities in the pressure relief plate and the target and target backing plate assembly enclosing those heat exchange cavities, and/or the heat exchange passages are defined by having heat exchange cavities formed in the second side of the target and target backing plate assembly such that, when the first side of the pressure relief plate is contacted to the second side of the target and target backing plate assembly, the heat exchange passages are formed between the heat exchange cavities in the target and target backing plate assembly and the pressure relief plate enclosing those heat exchange cavities.

There is contact of opposed sides of the target and target backing plate assembly and the pressure relief plate in excess of contact of peripheral areas of the target and target backing plate assembly and the pressure relief plate. There is also contact of opposed sides of the pressure relieving plate assembly and the insulation cover in excess of contact of peripheral areas of the target and pressure relieving plate assembly and the insulation cover. This contact in the non-peripheral (e.g., central) portions of these opposed sides bordered within the respective peripheral areas can be achieved by these sides having fins/walls extending from the respective sides to contact opposed fin/wall surface or other surface area of the respective opposed side. These contacts in these nonperipheral portions help the target assembly to withstand pressure forces upon or within it.

For example, one embodiment of the sputtering apparatus of the present invention primarily comprises a sputtering process chamber, a sputtering target assembly, an adjustable magnetron assembly, and provides a sputtering target assembly with integral heating/cooling and pressure relieving passages. A series of cavities/grooves and fins/walls are constructed on both sides of a heat exchanger/pressure relieving plate within the sputtering target assembly. A first side of the heat exchanger/pressure relieving plate is attached to a target backing plate to form heating/cooling passages within the sputtering target assembly. A second or opposing side of the heat exchanger/pressure relieving plate is attached to an insulation cover to form, within the sputtering target assembly, pressure relieving passages with the sputtering process chamber. The target assembly completely covers and seals against a high-vacuum-compatible insulator resting over and sealed to the top flange of the sputtering processing chamber. A magnetron assembly, e.g., a planar magnetron. assembly, resting over the target assembly, is independent from vacuum, or vacuum components, and provides means to move or scan about a magnetron or magnet array over the target assembly.

The distance between the magnetron and the target assembly can be adjusted throughout the useful life of the target independent from vacuum, or vacuum components. Depending upon the use, it may be desirable for the magnetron or magnet array to produce an intense, narrow plasma field for an improved target erosion pattern. However, such intense, narrow plasma fields are not necessary, and depending upon the use might not be desired. An insulating sleeve that also centers the target assembly to the sputtering process chamber protects the perimeter of the energized target assembly. In this way large substrates can be sputtered effectively and uniformly without adverse sputtering effects due to target deflection and cooling deficiencies, and without affecting the vacuum integrity in the sputtering process chamber due to service requirements to the magnetron assembly.

These sputtering assemblies may be employed in magnetron sputtering generally. In some instances they may assist to achieve directional emission characteristics which can be maintained through ballistic transport of the emitted particles and simple geometric considerations, which promote a high degree of directionality to the substrate incident sputtered particle flux. Directional emission refers to an angular distribution of as-emitted sputtered particles whose flux intensity is characterized by a distribution of particles in which the majority of emitted particle flux is contained within a narrow peak, or peaks, superimposed upon a low level background angular distribution. Ideally, the directionally emitted material arrives at the substrate at about the same one or few narrow ranges of angles most characteristic of emission from the target material. This makes it much easier to uniformly coat high aspect ratio features on the substrate.

BRIEF DESCRIPTION OF THE DRAWINGS

FIG. 13 is a schematic side cross-sectional view of the embodiment shown in FIG. 3;

FIG. 14 is a schematic side cross-sectional view of a second embodiment of the present invention, wherein a side of the target backing plate provides fins and heat exchange fluid cavities and a side of an insulation cover provides fins and vacuum cavities;

FIG. 15 is a schematic side cross-sectional view of a third embodiment of the present invention which employs heat exchange fluid channels drilled through the heat exchanger/pressure relief plate and a side of an insulation cover provides fins and cavities;

FIG. 16 is a schematic side cross-sectional view of a fourth embodiment of the present invention that employs heat exchange fluid channels drilled through the target backing plate;

FIG. 17 is a schematic side cross-sectional view of a fifth embodiment of the present invention that employs a monolithic target/target backing plate.

DETAILED DESCRIPTION OF THE PREFERRED EMBODIMENTS

Figure 1:
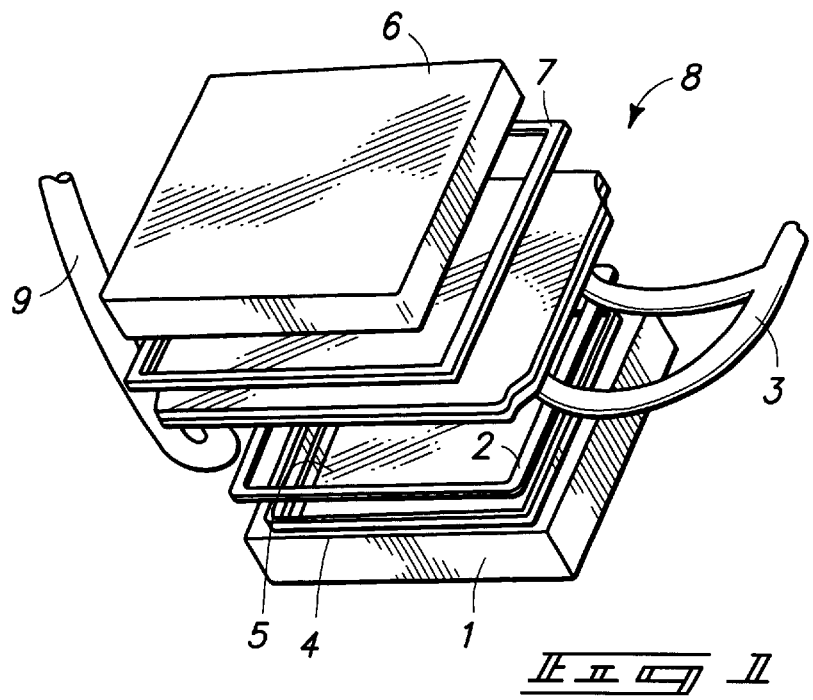
FIG. 1 is a simple representation of a sputtering device shown in prior art, a planar magnetron sputtering device, comprised primarily of a target assembly with internal cooling passages and a pressure-relieving top chamber, is generally placed over a sputtering opening of a sputtering chamber to seal the chamber. The forces acting on the target assembly due to vacuum in the process chamber are equalized, or at least are made to be closer in pressure, by employing a vacuum in the top chamber.
Figure 2:
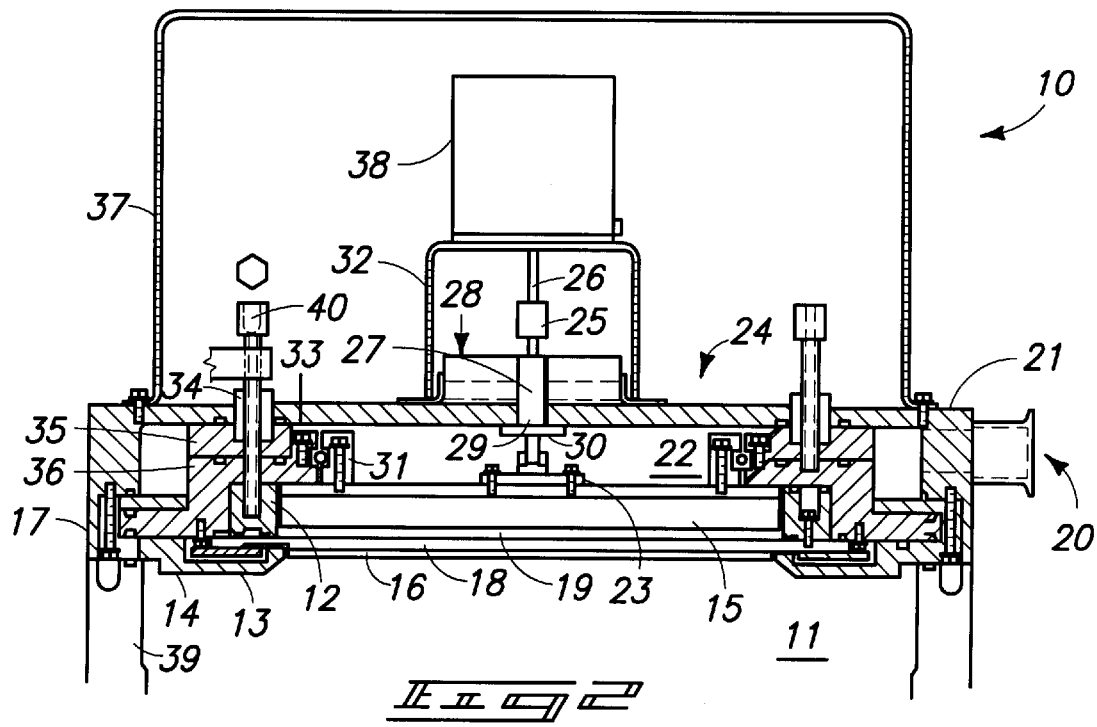
FIG. 2 is a cross-sectional view of a prior art magnetron sputtering system wherein the target and magnetron assemblies are provided with heat exchange channels to cool the target. The magnetron sputtering system also generates a low pressure region in the magnetron assembly such that the backing plate sees a pressure differential much lower than atmospheric pressure.

The new configuration for a high productivity sputtering device, by providing a target or cathode assembly including a thin integral cooling and pressure relief structure, includes a sputtering process chamber having a top peripheral flange surface. A target assembly is supported on the flange. The target assembly includes a target, a backing plate, a heat exchanger/pressure relieving plate, as well as an insulation cover; all in one integral assembly.

In a monolithic configuration the target (e.g., material to be consumed) and target backing plate can be a single piece of material; an O-ring groove (for sealing against the main insulator resting on the process chamber) and other features are machined into it. In other instances the target material is separate from the target backing plate and is joined with the target backing plate using commonly known joining techniques such as soldering.

The heat exchanger/pressure relief plate, with cavities or grooves machined or formed on both sides therein, is firmly attached to the target backing plate; this side of the heat exchanger/pressure relieving plate which is in intimate contact with the backing plate serves as a heat exchanger by providing a path for cooling fluid in which to flow. The other side of the heat exchanger/pressure relief plate is in intimate contact with an insulation cover to form a vacuum pressure-relieving chamber with the process chamber by providing a path to rough vacuum which is shared with the process chamber or may be independently pumped but pressure synchronized with the process chamber vacuum state.

The vacuum forces exerted on the target assembly by the process chamber are reduced substantially and nearly equally by the vacuum forces exerted on the pressure relieving passage (pressure relieving chamber) formed by the heat exchanger/pressure relieving plate with the insulation cover. Typically, the pressure relieving chamber is a pressure equalizing chamber.

The cavities or grooves have intermediate fins or walls that help maintain the dimensions of both the cooling and the pressure relieving passages over the wide span of the heat exchanger/pressure relieving plate. The fins or walls prevent the pressure in either the cooling or the pressure relieving passages to cause significant deflections of the heat exchanger/pressure relieving plate, or the target and its target backing plate, or the insulation cover. Of course the fins and walls can be arranged in a wide variety of configurations and shapes, e.g., spiral, radial, "v" type layouts and so on.

For ease of, fabrication, the heat exchanger/pressure relieving plate is machined from 6061-T6 aluminum alloy plate that may be anodized for improved corrosion resistance, except in the area where the power contact is attached.

The heat exchanger/pressure equalizing plate must be tightly joined to the back of the target backing plate so that a tight seal is created for the cooling fluid. The cooling fluid cavities or grooves are configured in such a way so as to distribute the cooling liquid flow over a substantial area of the target backing plate; thereby, providing a maximum cooling or heating effect over the whole target at a generally uniform rate.

The heat exchanger/pressure equalizing plate can be joined to the target backing plate by any reliable means. However, it has been found that O-ring seals secured with standard fasteners (preferably non-magnetic) are highly reliable and cost effective means to join the heat exchanger/pressure equalizing plate to the target backing plate, and still maintain a highly reliable seal for the cooling liquid to flow.

Likewise, the insulation cover unit is tightly joined to the heat exchanger/pressure relieving plate using O-ring seals and standard nylon fasteners in order to maintain the insulation integrity of the insulation cover. The insulation cover is electrically isolated from the energized sputtering target. Typically, this is achieved by having the insulation cover made entirely of insulating material and/or electrically insulated from the energized sputtering target. The insulation cover unit may be a plate or have another appropriate shape.

In another embodiment, the cooling fluid passages and grooves are instead machined on the target backing plate. Likewise, vacuum passages and grooves can be machined on the insulation cover. Therefore, the heat exchanger/pressure relieving plate can be manufactured as a flat sheet-metal piece secured between the backing plate and insulation cover. However, for example, when solder bonding, a non-grooved backing plate is generally preferred, in particular for ease of inspecting the solder-bonded joint.

The full target assembly is comprised of a target, backing plate, heat exchanger/pressure relieving plate, insulation cover, cooling fluid and vacuum lines, and male (non-energized end) cathode-power contact. The target assembly, fully assembled, is placed over the main insulator resting on the sputtering process chamber.

The electrically charged target assembly is isolated from the sputtering process chamber by resting over the main insulator which is normally made of a ceramic material such as fired alumina (99.5% $Al_2O_3$.). The alumina main insulator provides a high dielectric-strength, non-flammable, non-permeable insulation that can maintain dimensional stability under the high loads exerted by vacuum in the process chamber.

In addition, the perimeter of the target assembly is isolated from operator contact by an insulating sleeve that extends from the insulation cover into the perimeter of the process chamber. The insulating sleeve can be constructed in sections that are machined from phenolic bar-stock. The sections may be bonded together using tongue and groove joints for added strength, and if desired, precise positioning of the sections can be accomplished by machining mating holes at the joint and positioning the sections using close-tolerance phenolic dowel pins for alignment. Of course, a monolithic insulating sleeve can be formed by manufacturing processes such as casting or machining from plate stock.

To cool or heat the target assembly, high resistivity water is normally used so that there is negligible current loss through the cooling passages while the target assembly is being energized. A pair of grounded inlet/outlet insulated hose assemblies are connected to hydraulic fitting ports machined into the top corners of the insulation cover. The hydraulic fitting ports are in communication with mating openings (seams of the openings sealed by O-rings) to the cooling passages formed between the heat exchanger/pressure relieving plate and the backing plate, the inlet/outlet insulated hoses provide ample cooling/heating fluid to the backing plate.

The insulation cover is machined preferably of phenolic for its high mechanical and dielectric strength properties, but other insulation materials, for example, DELRIN (E. I. Du Pont de Nemours and Co. Corp., Wilmington, Del.) or polycarbonate may also be used.

In addition, one or more vacuum-fitting ports are machined into the insulation cover to provide one or more passages for vacuum in the space formed between the heat exchanger/pressure relieving plate and the insulation cover.

Once the target assembly is placed over the process chamber, and while waiting for proper vacuum levels to be reached, the magnet enclosing chamber may be positioned over the target assembly in preparation for sputtering. The magnet enclosing chamber, once positioned over the target assembly, places the magnetron near the top of the insulation cover (of the target assembly), at a short distance from the consumable surface of the target. In addition, the power supply connection is made; that is, the female contact (energized-end or end that connects to the power supply, DC or RF generator) mounted in the magnet enclosing chamber mates with the male cathode-power contact mounted on the target assembly. However, the enclosing magnet chamber may be removed at any time from the assembly without affecting the vacuum components or vacuum integrity of the processing chamber.

In the present configuration, a magnet sweeping mechanism placed in the magnet chamber can be adjusted to optimize the distance between the magnetron and the surface of the target; thereby, improving the target erosion pattern; and consequently, the film characteristics on the substrate. If desired, the magnetron comprises a permanent magnet array, that has a very strong magnetic field, and is very narrow (narrow turn-around region) that produces a "cigar-like" plasma field.

Since permanent magnets reduce their magnetic strength at elevated temperatures, the magnet chamber may be fitted with forced-air cooling to keep the magnetron at nearly ambient temperature while sputtering; thereby preserving the permanent magnet's magnetic strength, and allowing the magnetron to operate at very high deposition rates.

In the present configuration as described, very large-area substrates are uniformly coated using targets slightly larger than the substrates. The design uses the accepted design rule that the target overhang by about 2.0" in any direction over the substrate; however, for improved film thickness uniformity, larger area targets are used, but at the expense of increased costs.

Further, it is generally accepted that electron flow at the turn-around regions of a sweeping magnetron vary at the end of travel (decelerating, stopped, and accelerating towards the other end of the scan while in close proximity to the broad-side of the anode or dark-space shield); therefore, the plasma intensity at one end of the magnetron varies from the other end of the magnetron. This difference in plasma intensity causes one corner of the target to erode differently from the other.

In the present configuration, in order to maintain uniformity of deposition throughout the useful life of the target, the magnetron distance to the target surface is adjusted periodically by adjusting one or more of the springs height mounted on the magnetron-lift base plate. Similarly, to compensate for electron-flow effects at the end of travel, the inclination of the magnetron with respect to the direction of travel is adjusted by rotating the slide shafts supporting the magnetron, that is, adjusting the parallelism of the slide shafts with respect to the direction of motion.

Typical techniques to practice magnetron sputtering suitable for use with cathodes according to the present invention include dc sputtering, rf sputtering, microwave sputtering, or other suitable frequency techniques. Such methods are disclosed by U.S. patent application Ser. No. 09/559,600, filed Apr. 28, 2000, U.S. patent application Ser. No. 09/671,681, filed Sep. 28, 2000, and U.S. provisional patent application Ser. No. 60/235,913, filed Sep. 28, 2000, all of which are incorporated herein by reference in their entirety.

An optional goal of the present invention is to provide cathodes to assist in achieving directional PVD and/or IPVD without a secondary, post emission ionization stage beyond that ionization produced by the cathode.

Target Materials

The present thin target assembly benefits sputtering targets generally. Some targets may include strong crystallographically textured, highly uniform (across its area and through target thickness) polycrystalline target materials and/or single crystal sputtering targets (which may be one piece or mosaic structures comprised of several pieces of single crystal of one or a mixture of crystallographic orientations) in a manner to produce a highly directional emitted sputtered particle flux from a scanning magnetron sputtering device. Note, the degree of texture is generally defined herein through the Multiple of a Random Distribution (MRD) (or density). The MRD being determined by X-ray diffraction (XRD) pole figure measurement. The MRD compares an orientation density with that of a sample with no preferred orientation (uniform distribution). Other simpler descriptions relate the intensity of the diffraction signal from a given orientation in terms of relative intensity (ratio) with respect to diffraction from other specified peaks or a specific peak in the XRD spectrum.

The sputter targets may be made by a variety of techniques, for example directional solidification techniques, seed techniques, or Electrochemical Deposition Techniques (EDT).

It would be desirable to make commercial size targets by a seed technique which may be a variation of a directional solidification technique described below, without or with a seed crystal, or a variation of a Bridgeman technique, Czochralski technique, or recrystallization technique, or other techniques.

Seeded techniques utilizing directional solidification of materials can produce sputtering targets with predetermined crystallographic orientation. At least three techniques can provide a predetermnined texture. These methods include: Gradient Freeze, Bridgman and Czochralski.

The Gradient Freeze method imposes a controlled temperature gradient to directionally solidify the liquid metal in either single crystal orientation or in a multi grained columnar structure with predetermined orientation.

The Bridgeman technique uses a fixed temperature gradient as supplied by a multi zoned furnace with induction, resistance, radiant, plasma or electron beam as the heating source. The solidification interface velocity and profile is controlled by the relative motion between the material and furnace. The method includes stationary furnace elements with moving crucibles or stationary crucibles with moving furnace elements.

In the Czochralski technique a rotating seed of predetermined orientation is dipped in a liquid bath of the growth material, and then slowly withdrawn. The temperature of the molten bath is held close to the material's melting point to ensure that the seed does not dissolve into the bath. During withdrawal, crystalline material solidifies on the end of seed in the same orientation as the seed. The liquid bath is kept molten with the use of induction, resistance, radiant, plasma or electron beam as the heat source.

An embodiment of the directional solidification technique employs a Vacuum Induction Melter (VIM) that utilizes two sets of heating elements (coils) and Thermocouples (T/Cs) stacked vertically to heat a crucible and melt the material for the target. The temperature is monitored with these two T/Cs and a Pyrometer. The material undergoes a melting phase in which both sets of heating coils are used and a cooling phase during which only the top set is used. This forces the crucible and target material, e.g., Copper, to cool from the bottom ideally allowing one large grain to grow, although typically a few large grains can form.

Directional solidification samples may be sawed to expose suitably orientated sections of crystal.

The Electrochemical Deposition Technique (EDT) endeavors to electro-form a columnar, crystallographically orientated deposition structure based around this process.

Generally for directional emission, a single crystal or a polycrystalline material in which there is a dominant certain texture or a suitably engineered polytextured material in which certain textural components having desired emission components are combined and distributed in appropriately controlled volume fractions to produce a desired emission spectrum is preferred.

Single crystal emission can be conal, or approximate to conal, e.g., in Cu (110) and (111) systems. That is, emission directionality can be achieved in two dimensions. When considering deposition using polycrystalline targets, other target attributes such as grain size and grain size distribution may be important.

Surface Conditions

Sputter emission is a near surface effect. Most emission occurs from depths within a few atomic layers from the surface. The condition of the target surface therefore strongly affects the angular distribution of as-emitted sputtered particles for both single crystal and polycrystalline targets. The initial surface crystallographic texture and topology, presence of surface defects, such damage including that induced during fabrication, for example strain effects and/or contamination, e.g., foreign material, oxides etc. of the sputtering target prior to sputtering are factors that may affect the emitted angular distribution (EAD) and directionality. Also, the target's surface topology, texture and/or surface damage produced by particle irradiation developed through the sputtering process (related to power applied to sputter the target, sputtering gas species and other process variables), backsputtered particles and sputter generated contaminant films, etc., are factors that may affect the emitted angular distribution (EAD) and directionality.

Generally, polycrystalline commercial targets have a high quality commercial no. 16–32 machined finish prior to sputtering. Single crystals typically have a diamond turned mirror finish or chemo, or chemomechanical surface preparation. Sputter conditioning can then be applied, if required, to establish directional emission in suitable target materials through removal of surface contamination, damage, etc., and to establish a directionally emitting surface layer. The extent and ability of sputter conditioning required to produce such directional emission is dependent on the nature of the surface preparation. Sputter conditioning occurs as soon as the target is exposed to the sputtering particle flux. Highly polished, low damage surfaces, e.g., diamond turned surfaces may not require any intentional sputter pre-conditioning or less conditioning than relatively rough, damaged machine finished surfaces.

Maintaining Directionality

From basic considerations at a macroscale, in magnetron sputtering the dynamic development of the sputtered surface topology into a macroscale racetrack groove, through non-uniform sputter erosion, alters the effective angles of incidence of the incident sputtering particles at the target surface. A dynamically changing microtopology is always produced during sputtering, even on the surfaces of highly polished single crystals; and given large differences in sputter rate typically exist over the racetrack cross section. However, it is possible to maintain the intrinsic directional flux from single crystal or highly crystallographically textured polycrystalline targets.

The macroracetrack groove is a consequence of the cross-sectionally varying sputter rate across the racetrack induced by the non-uniform racetrack plasma density produced in typical magnetron crossed electric and magnetic fields. Superimposed over the macroracetrack groove and other macrotopological features, e.g., machining grooves in the early stages of target use, develops a fine scale, dynamic, steady state, "natural" sputter topology. "Natural" sputter topologies are complex. Generally, once a "steady state" is reached, they are characterized in metallic target systems by low angle reliefs, i.e., features which generally exhibit angles of less than 30 degrees with respect to the hypothetical surface plane of the target. Differences in height between features in the "steady state" "natural" surface topology are estimated to be less than about 100, generally less than about 50, or typically less than about 30, microns. In other words, the localized difference between the height of a peak and its adjacent valley or plain is less than about 100, about 50 or about 30 microns. Of course, the absolute difference in height between the highest and lowest feature of the target may be over 100 microns, as for example where the target has an overall curved shape. This is intended as a guide rather than a complete description of these phenomena. The natural topology employed with the present invention is that which can be maintained at steady state across the target during sputtering over an extended useful period.

The target surface topology is dynamic during sputtering. Complex erosion mechanisms can allow a dynamic equilibrium, or steady state to be established. For example, the hills and valleys of the topology can effectively erode at differential rates to keep the differences in height between surface features below a predetermined tolerance. This is achieved by employing an overall erosion rate less than that which overwhelms the differences in erosion rates associated with the different heights of surface features in the "natural" topology. As a result, this topology can be maintained in a steady state during sputtering, due to an overall steady erosion, for an extended period of time, e.g., at least 30 minutes, at least one hour, or at least two hours. In contrast, if an overly fast erosion rate is selected and/or a racetrack plasma is applied statically for sufficient duration, the target would decay to an unsuitable macroracetrack scale topology induced by the cross-sectionally varying sputter bombardment rate resulting from the racetrack plasma density profile.

For highly uniform, crystallographically textured, directionally emitting target materials generally the as emitted sputtered particle flux angular distribution (EAD) is not significantly affected by the shape, i.e., intensity distribution or the particle energy distribution (typically <1000 eV), of the incident sputtering ion flux profile in magnetron sputtering. Rather, only the integrated intensity of the emitted flux profile across the racetrack, point to point, is affected, not the general shape of the emission distribution. Further, in spatially resolved emission experiments, emission is not necessarily cosine in nature. Small rotations of the EAD profile can occur. These rotations are believed due to variation of the angle of incidence at the target of the sputtering particles. These can be minimized by suitable cathode operation, design of the magnetrons crossed magnetic-electric field and sputter gas selection.

Further, controlled directional emitted particle flux of such materials can be maintained over an acceptable power density applied to the target until sufficient damage or topological disruption away from the above-described "natural topology" produced by the sputtering ions disrupts the target surface and near surface sufficiently to degrade the directional emission condition. Similarly, e.g., a high degree of backsputtering or development of coarse sputtered surface topology can degrade the directional emission effect. Generally for suitably textured targets, directional emission can be observed after a short or even negligible sputter bum-in period for a variety of carefully applied, surface finishes, e.g., diamond turned, chemically etched, polished (mechanically, chemomechanically, electrochemically) or carefully machined targets.

Initial Surface Condition

Another factor to consider is initial surface condition. Due to the surface nature of the sputter effect, initial surface condition is important. It can be the case, for a poorly prepared initial surface on a directional target material, that directionality may not be induced even after prolonged sputtering. There appears to be a threshold tolerance for surface condition that is difficult to overcome even by prolonged sputter erosion, as the act of sputter erosion itself can then tend to perpetuate a non-directional surface condition. Generally, initial surface finish should be better or close to the dimensions of the "natural" surface topology as described above at least where directional emission is desired.

For example, the pre-sputtering surfaces of typical "machined" targets may have a grooved finish close to the topographical dimensionality of the "natural" surface topology. Machined grooves may be typically less than 20 microns deep, approximately 100 microns wide, forming angles of ~20 degree to the surface plane. "Polished" targets may typically have a pre-sputtered mirror finish to better than 1 micron. Similarly "diamond turned" surfaces may typically have a pre-sputtered mirror finish to better than 0.04 micron.

Magnetron Cathode (Magnet and Target) Design

Figure 3:
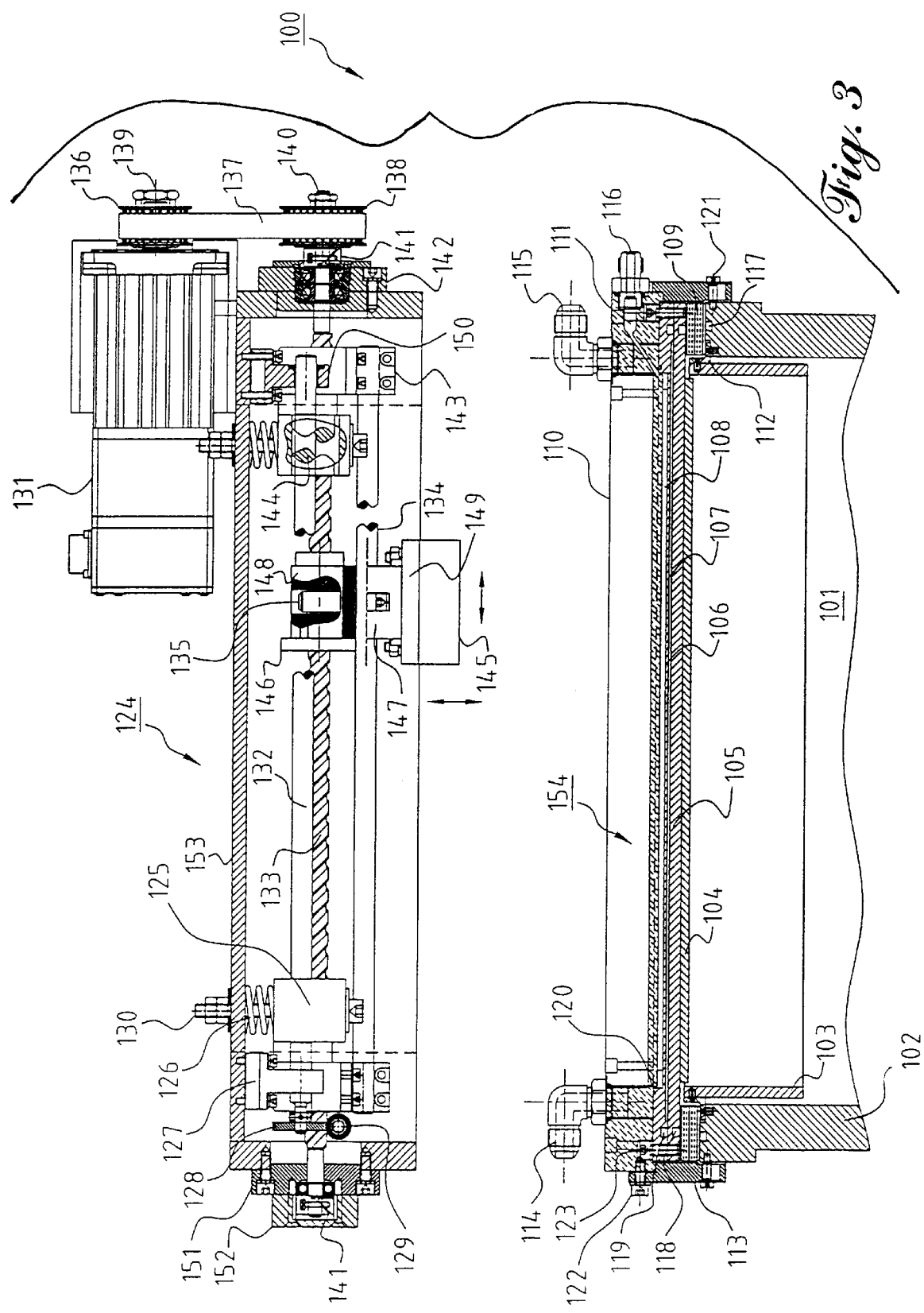
FIG. 3 is a detailed cross-sectional view of a first embodiment of a target assembly and magnetron assembly according to the present invention taken parallel to the motion of the magnetron.

FIG. 3 depicts a detailed cross-sectional view of an embodiment according to the present invention taken parallel to the motion of the magnetron 145. A sputtering apparatus 100 comprises primarily a sputtering process chamber 101, a target assembly 154, and a magnetron assembly 124. The sputtering process chamber has a top flange 102, the flange has a shape and perimeter according to a predetermined substrate size; that is, a cylindrical flange is generally designed for an apparatus processing round-shape substrates such as silicon wafers used in semiconductor fabrication; similarly, a rectangular flange is generally designed for an apparatus processing rectangular-shape substrates such as glass sheets used in flat-panel display fabrication.

The target assembly 154 is positioned over a main insulator 109, preferably made of ceramic material, and seals to it using an O-ring (not shown, e.g. VITON) inserted into O-ring groove 118 that is machined into the target backing plate 105 within target assembly 154. The main insulator 109, positioned over the process chamber flange 102, insulates the energized target assembly 154 from the sputtering process chamber 101. The main insulator 109 seals against process chamber flange 102 using an O-ring (not shown, e.g. VITON synthetic rubber E. I. Du Pont de Nemours & Co. Corp., Wilmington, Del.) inserted into O-ring groove 117 machined into the top of flange 102 of process chamber 101. Therefore, in the above-described manner, the target backing plate 105, of target assembly 154, covers the sputtering opening of sputtering process chamber 101 and seals the opening.

The target assembly 154 includes a sputtering target ("target") 104, previously mentioned target backing plate 105, a heat exchanger/pressure relieving plate 106, and insulation cover 110; each of the above mentioned components having first and second sides, the first and second sides being opposite from one another.

A first side of sputtering target 104 is consumed by the sputtering action in sputtering process chamber 101. A removable dark space shield 103, extending into the opening of process chamber 101, surrounds the perimeter of sputtering target 104 and prevents sputtering beyond the edges of the first side of sputtering target 104. Dark space shield 103 forms part of the anode, and is positioned a short distance (generally between 0.060" to 0.125") away from both the sputtering target 104 and target backing plate 105. Dark space shield 103 is secured to the process chamber 101 by brackets 112 and vented machine screws (preferably non-magnetic.) Brackets 112 mount over a mating recess machined on the top of flange 102, vacuum side of the process chamber.

A second side of sputtering target 104 is in intimate contact to a first side of target backing plate 105; the two components may be joined by any conventional manufacturing method such as bonded with Indium solder; however, the target 104 and target backing plate 105 can be monolithic.

A second side of target backing plate 105 is in intimate contact with a first side of heat exchanger/pressure relieving plate 106. Cavities and fins machined in the first side of heat exchanger/pressure relieving plate 106 form, together with target backing plate 105, heating/cooling fluid passages 107 defined by fins 107A (FIG. 13). One or more inlet and outlet heating/cooling fluid openings 170, 171 are machined near the corners of heat exchanger/pressure relieving plate 106 to communicate with inlet and outlet heating/cooling hydraulic fittings 114, 115. The seam between the two plates is sealed by an O-ring (not shown, e.g. Buna) inserted into O-ring groove 119 machined into first side of heat exchanger/pressure relieving plate 106. The two plates are tightly secured using standard machine screws fasteners 123 (preferably non-magnetic.) Inlet and outlet heating/cooling fluid openings and holes for fasteners (not shown) in communication with the heating/cooling fluid passages are sealed using concentrically mounted O-rings (not shown, e.g. Buna) with the openings and holes.

A second side of the heat exchanger/pressure relieving plate 106 is in intimate contact to a first side of the insulation cover 110. Cavities and fins machined in the second side of the heat exchanger/pressure relieving plate 106 form, together with insulation cover 110, pressure-relieving passages 108 designed to communicate with rough vacuum in sputtering process chamber 101. One or more vacuum ports are machined on the edges of insulation cover 110 to insert vacuum fittings 116. Vacuum communication with pressure-relieving passages 108 is made through drilled openings 111 in the insulation cover 110. The seam between the two plates is sealed by an O-ring (not shown, e.g. VITON) inserted into O-ring groove 120 machined into the second side of the heat exchanger/pressure relieving plate 106. The two plates are tightly secured using standard machine screws fasteners (preferably non-magnetic.)

Heating/cooling hydraulic fittings 114, 115 are inserted into the second side of insulation cover 110, and O-rings (not shown, e.g. Buna) seal the ports.

Insulation sleeve 113 surrounds target assembly 154 and extends into the perimeter of process chamber flange 102. Fixed fasteners 122 secure the insulation sleeve 113 to target assembly 154. Floating shoulder screw fasteners 121 secure the insulation sleeve 113 to the process chamber flange 102, and compensate for dimensional changes of the O-rings in the stack of parts once vacuum is made.

Process/deposition parameters such as magnetron electrical impedance, plasma intensity and uniformity, etc. can be controlled by adjusting the position of the magnetron with respect to the target as the magnetron sweeps the target surface. Magnetron assembly 124 provides a movable magnetron 145 secured by fasteners to base plate 149. At each end of base plate 149, a slide mount 147 (fitted with Permaglide® bearings) is mounted to receive slide shafts 134. The ends of slide shafts 134 are secured by supports 143 mounted to a magnetron lift base plate 125. Magnetron lift base plate 125 presses against four relatively stiff springs 126 placed at each of its corners. The springs 126 are compressed between magnetron lift base plate 125 and magnetron housing 153 by standard bolt and nuts connections 130.

The magnetron 145 slides freely on the slide shafts 134, and very little transverse load, due to the magnetron's weight, is transmitted to leadscrew 133; thereby, extending the life of the leadscrew. In addition, the magnetron is simply pushed/pulled axially by the motion of the leadscrew nut 146 driven by leadscrew 133.

Mounting supports 143 can be rotated slightly (as much as 45 degrees) to cause the magnetron 145 to travel slightly rotated from perpendicular to the leadscrew axis. This adjustment has proved advantageous in compensating for plasma electron-flow effects at the end of travel; that is, plasma effects as the plasma approaches the anode from broad side.

Nut mount 148 is firmly attached to leadscrew nut 146, and is fitted with a pair of Permaglide® bearings so that shafts 135 firmly mounted about the middle of base plate 149 can transmit the push/pull motion of the leadscrew 133 to the magnetron 145; in this manner, the magnetron 145 can also slide transversally to the axis of the leadscrew 133 which is the required motion for adjusting the distance between the magnetron 145 and the surface of target 104.

The distance between the magnetron 145 and the surface of target 104 is controlled by rotating a pair of cam shafts 132 using a pair of self-locking worm 129 and worm gear 128 set. It is advantageous to use a worm and worm gear set because of their self-locking property; that is, a worm gear can not drive the worm. The ends of cam shafts 132 are supported by mounts 150. Mounts 150 and shims 127 are firmly fastened to magnetron housing 153. Shims 127 may be used to control the parallelism of the magnetron with respect to the surface of the target 104, and compensate for manufacturing tolerances.

Cam shafts 132 contain a pair of cams 144 pressing against magnetron lift base plate 125; as the cams 144 rotate, it forces the magnetron lift base plate 125 to move crosswise to the axis of the cam shafts 132. Therefore, as the cams 144 rotate, the magnetron 145, sliding on slide shafts 134 that are mounted to supports 143 which mount to magnetron lift base plate 125, is also forced to move crosswise along with the magnetron lift base plate 125. This crosswise motion sets the distance between the magnetron 145 and the surface of target 104.

The leadscrew 133 is supported at one end by an axial angular contact ball bearing which is fitted inside housing 142, and at the other end by a radial ball bearing fitted inside housing 151. Housings 142, 151 are fastened to magnetron housing 153 to firmly retain the leadscrew 133 in it. Collar clamps 141 keep the axial angular contact ball bearing preloaded for improved leadscrew positional accuracy. Covers 152 (motor side not shown) protect personnel from coming in contact with moving parts that protrude from the magnetron housing 153.

As shown, the end of leadscrew 133 that is closest to housing 142 (axial angular contact ball bearing end) receives a driven pulley 138 retained to the leadscrew by a two-way shaft collar 140. Similarly, the shaft of servomotor 131 receives driver pulley 136 retained by two-way collar 139. The back and forth rotating motion of the servomotor 131 is transmitted to the leadscrew 133 by timing belt 137. If desired, any suitable motor can be used for this purpose.

Figure 4:
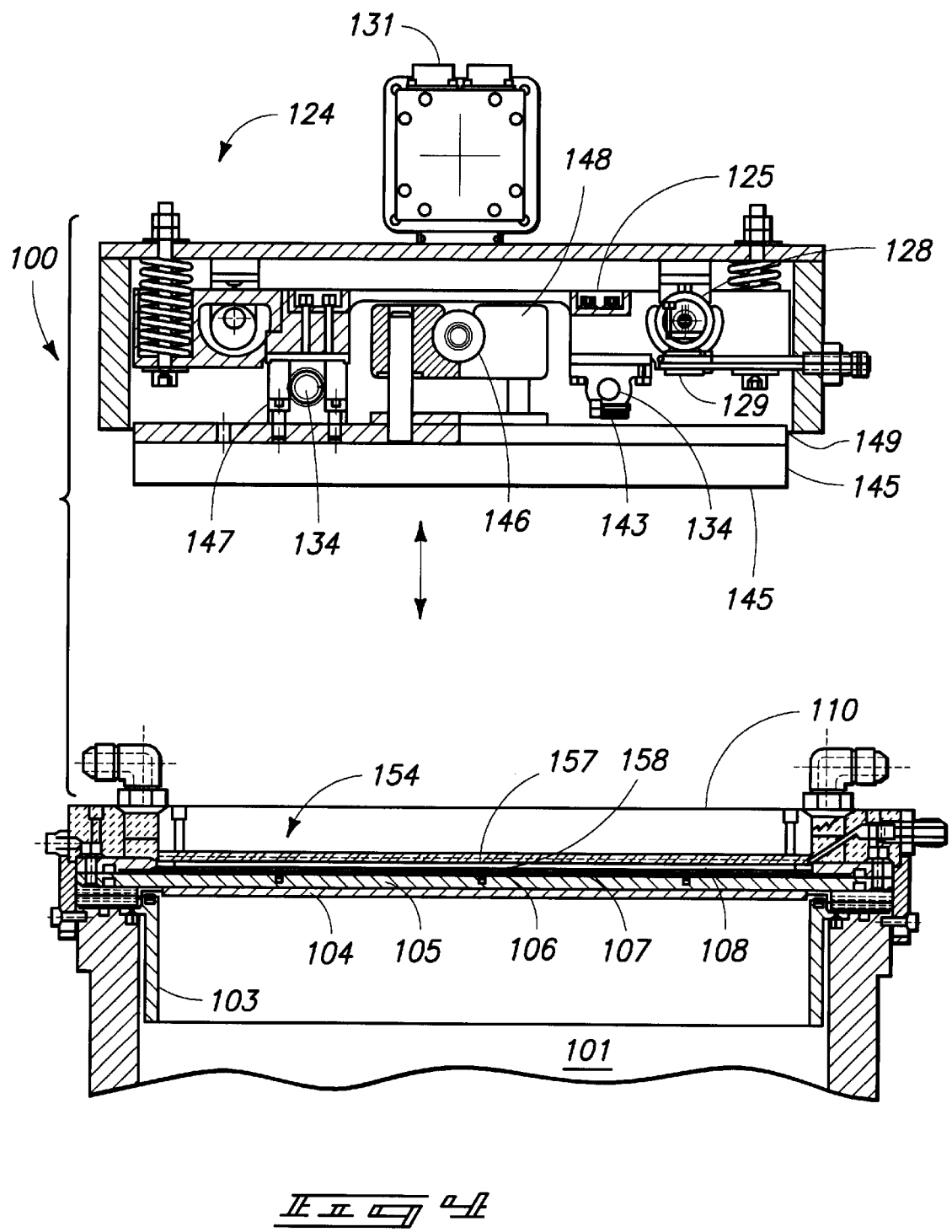
FIG. 4 is a detailed cross-sectional view of the embodiment shown in FIG. 3 taken perpendicular to the motion of the magnetron.

FIG. 4 is a detailed cross-sectional view of the embodiment shown in FIG. 3 taken perpendicular to the motion of the magnetron. The figure shows countersink fasteners 157 (preferably non-magnetic) securing the heating/cooling passages of target assembly 154 by pressing the heat exchanger/pressure relieving plate 106 against the target backing plate 105. O-rings (not shown, e.g. Buna) inserted into machined O-ring grooves 158 in the heat exchanger/pressure relieving plate 106, seal the holes for fasteners 157. Each O-ring groove 158 is machined concentrically with its corresponding hole for fasteners 157.

Figure 5B:
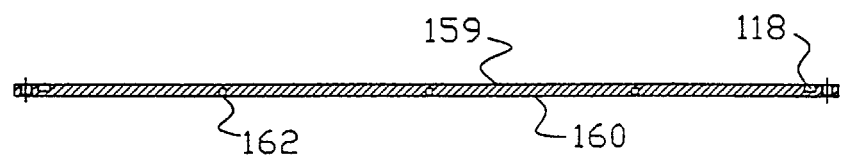
FIGS. 5A and 5B are top and cross-sectional views of a backing plate according to the embodiment shown in FIG. 3.
Figure 5A:
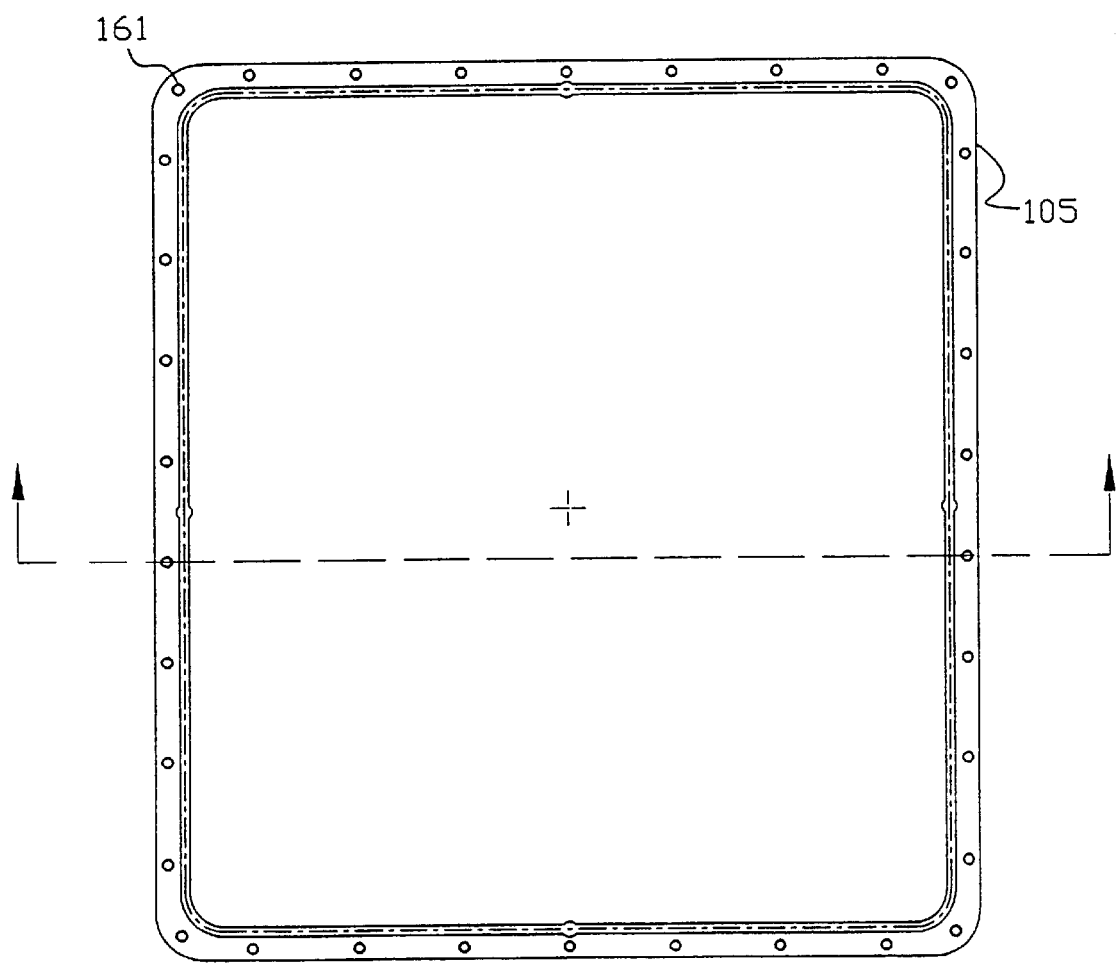

FIGS. 5A and 5B are top and cross-sectional views of a backing plate 105. FIG. 5B shows a first side 159, and second side 160 of backing plate 105. The area on the first side 159 of backing plate 105 that is enclosed by O-ring groove 118 receives target 104. The second side 160 of backing plate 105 receives heat exchanger/pressure relieving plate 106.

The heat exchanger/pressure relieving plate 106 is firmly secured to backing plate 105, within the area of heating/cooling fluid passages 107, by means of countersink fasteners 157 (preferably non-magnetic.) The fasteners 157 are retained by blind tapped holes 162 machined into the second side 160 of backing plate 105. In addition, through tapped holes 161 are also machined from the second side 160 of backing plate 105. Through tapped holes 161 retain fasteners 123 and a male (non-energized end) cathodepower contact. The fasteners 123 firmly secure the seam between heat exchanger/pressure relieving plate 106 and backing plate 105.

Figure 6B:
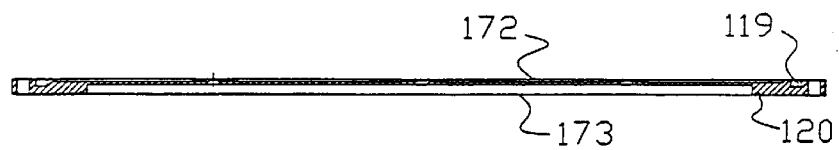
FIGS. 6A, 6B, and 6C are top, cross-sectional, and bottom views of a heat exchanger/pressure relief plate according to the embodiment shown in FIG. 3.
Figure 6A:
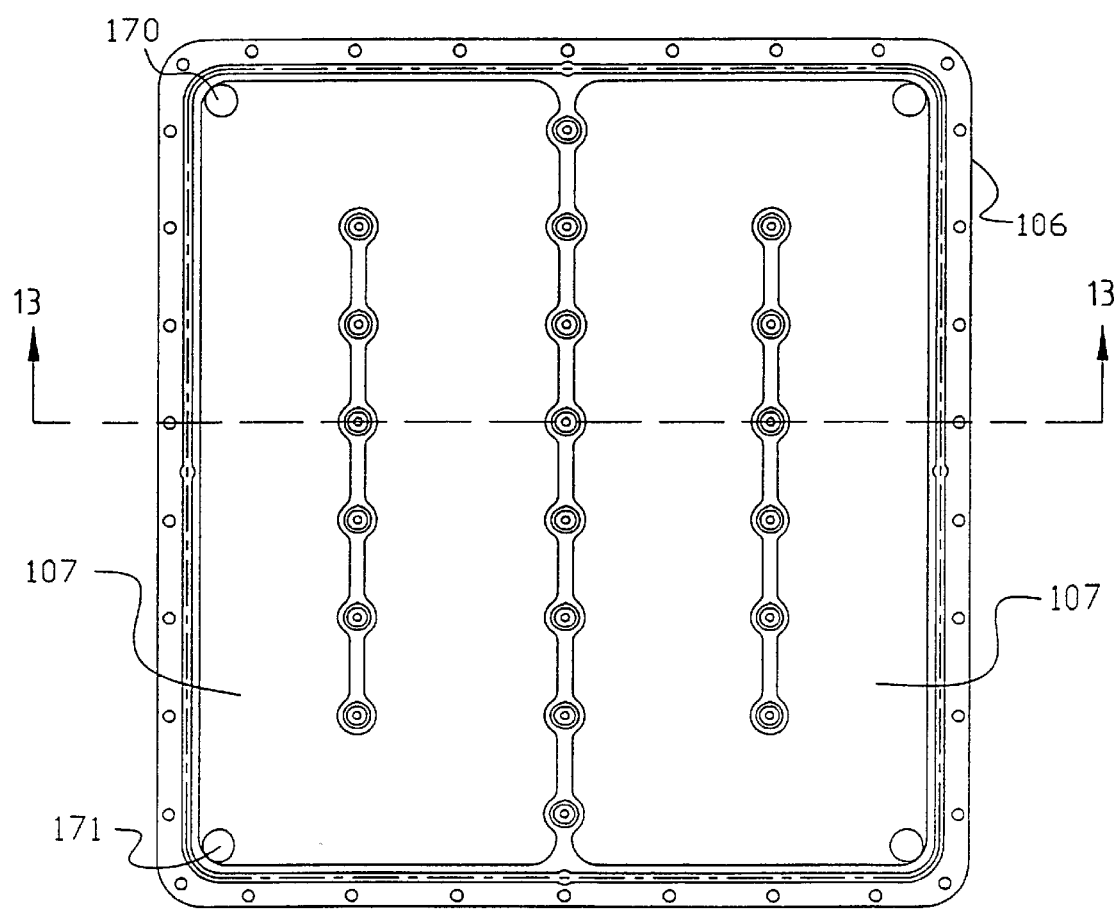
Figure 6C:
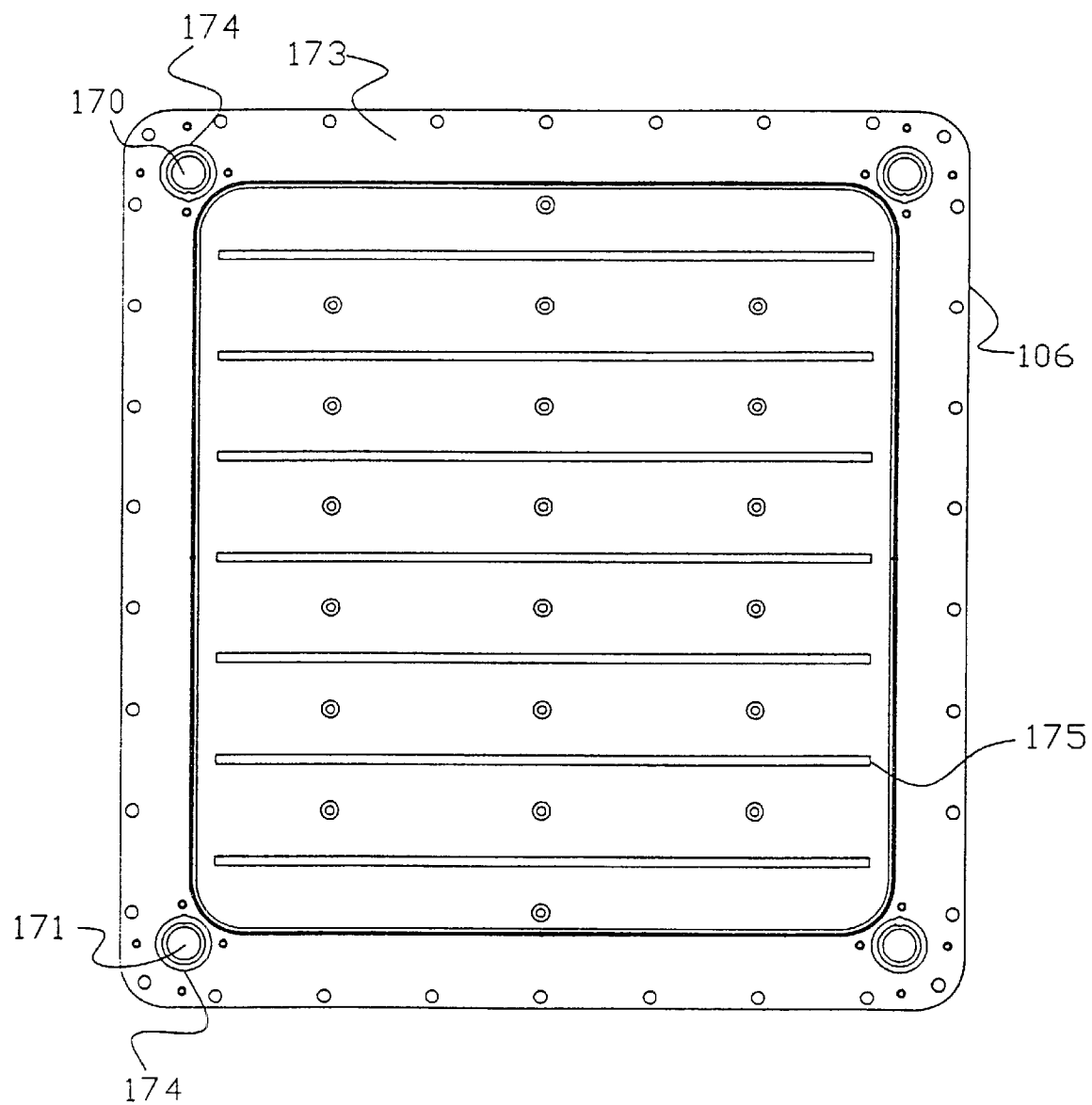

FIGS. 6A, 6B, and 6C are top, cross-sectional, and bottom views of a heat exchanger/pressure relieving plate 106. FIG. 6A shows the cavities and fins within heating/cooling passages 107 of heat exchanger/pressure relieving plate 106, and inlet and outlet coolant openings 170, 171 communicating with heating/cooling passages 107. FIG. 6B, a cross-sectional view, shows first and second sides 172, 173 of heat exchanger/pressure relieving plate 106. FIG. 6C shows machined O-ring grooves 174 that seal the seams of inlet and outlet coolant openings 170, 171 between heat exchanger/pressure relieving plate 106 and insulation cover 110.

Figure 7B:
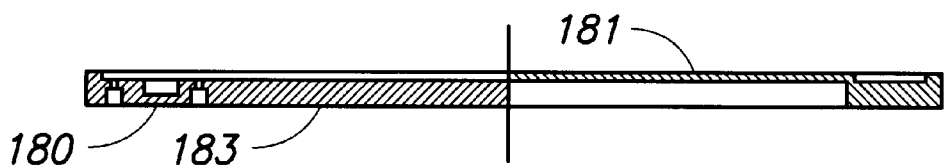
FIGS. 7A, 7B, and 7C are top, cross-sectional, and bottom views of an insulation cover according to the embodiment shown in FIG. 3.
Figure 7A:
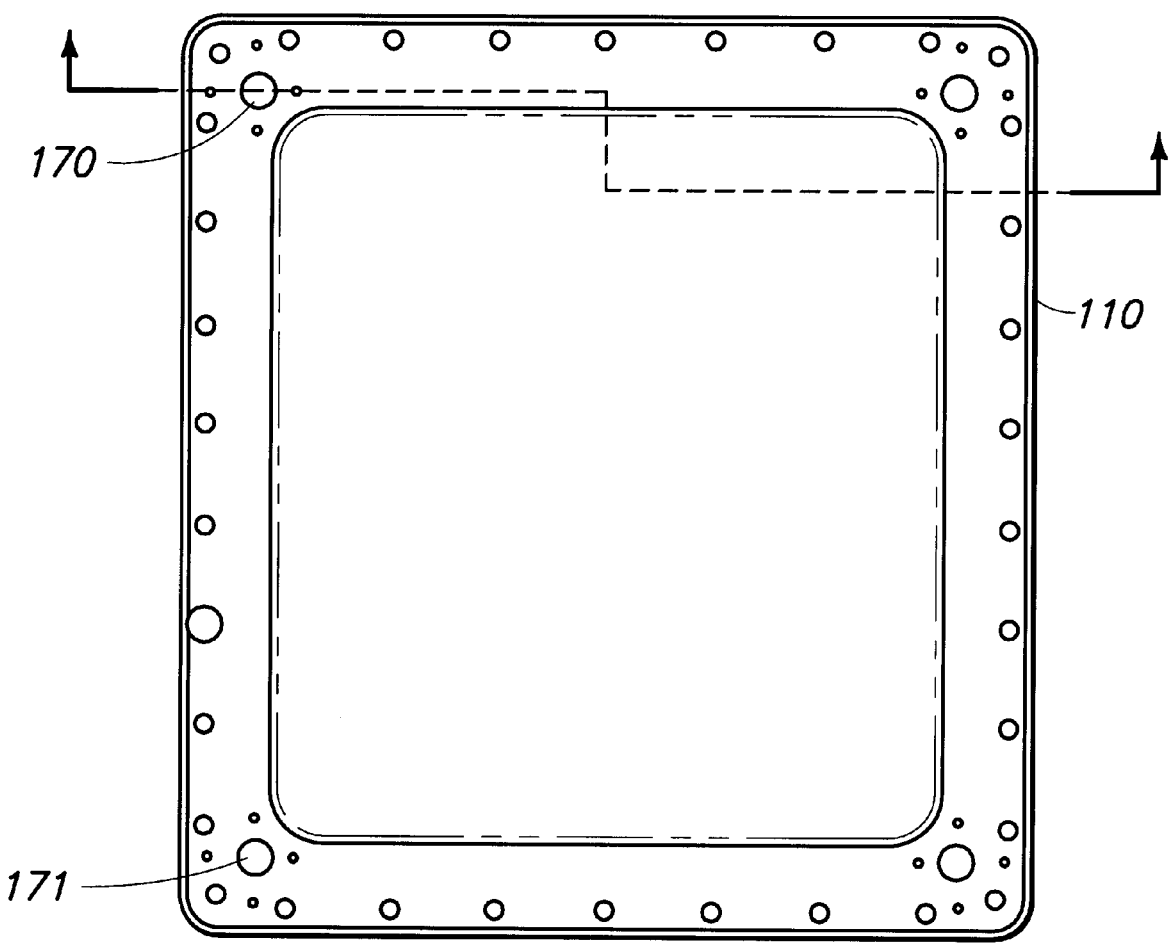
Figure 7C:
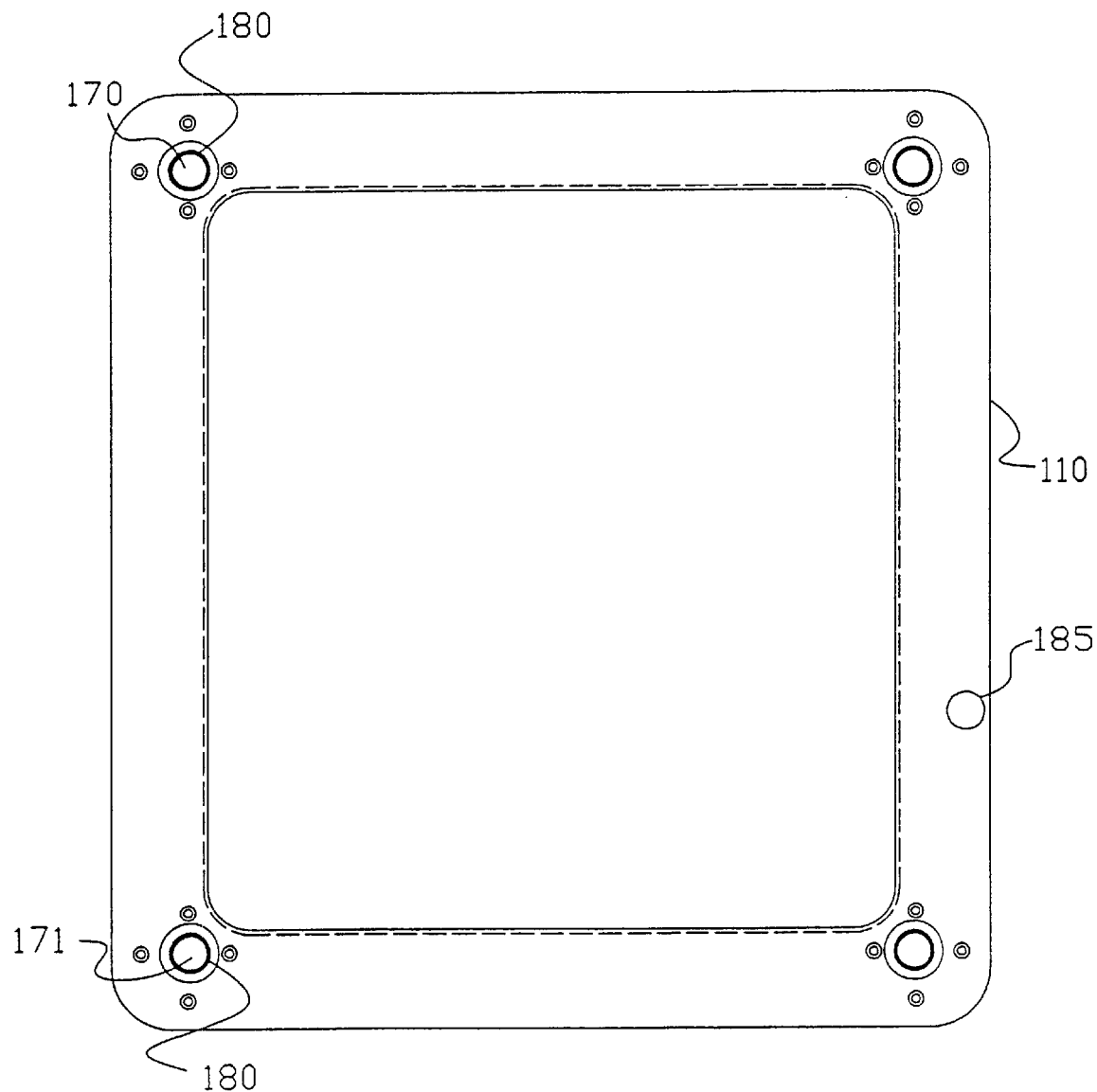

FIGS. 7A, 7B, and 7C are top, cross-sectional, and bottom views of an insulation cover 110. FIG. 7A shows a first side 181 of insulation cover 110, and inlet and outlet coolant openings 170, 171. FIG. 7B, a cross-sectional view taken from FIG. 7A, shows machined ports 180 that retain inlet and outlet heating/cooling hydraulic fittings 114, 115. Ports 180 are machined concentrically with inlet and outlet coolant openings 170, 171, and from the second side 183 of insulation cover 110. FIG. 7C shows an opening 185 for a male (non-energized end) cathode-power contact that screws into the backing plate 105.

Figure 8B:
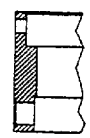
FIGS. 8A and 8B are top and cross-sectional views of an insulator sleeve according to the embodiment shown in FIG. 3.
Figure 8A:
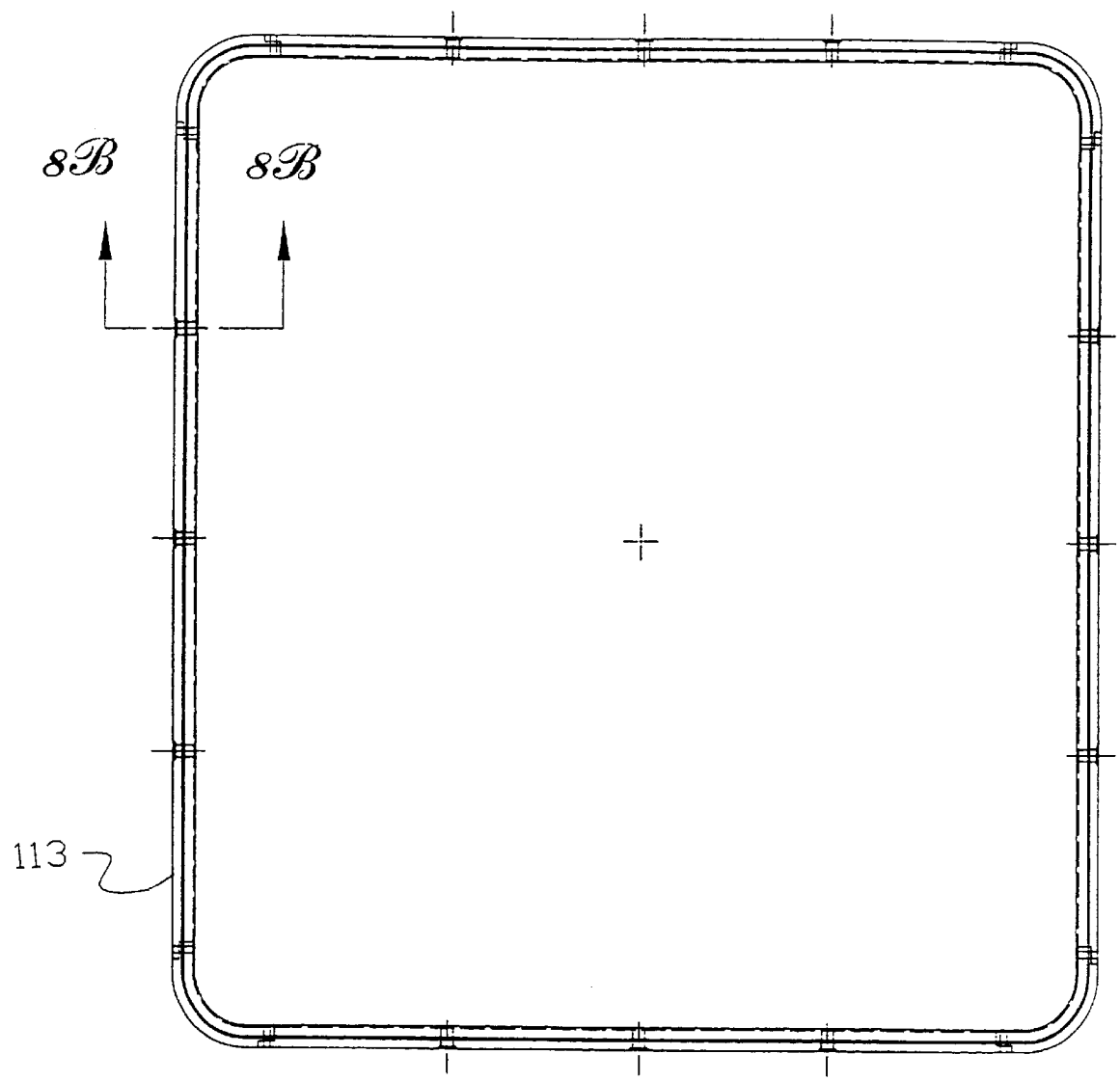

FIGS. 8A and 8B are top and cross-sectional views of an insulator sleeve 113 according to the embodiment shown in FIG. 3. In particular FIG. 8B is the cross-sectional view of the insulator sleeve 113 along view 8B—8B.

Figure 9:
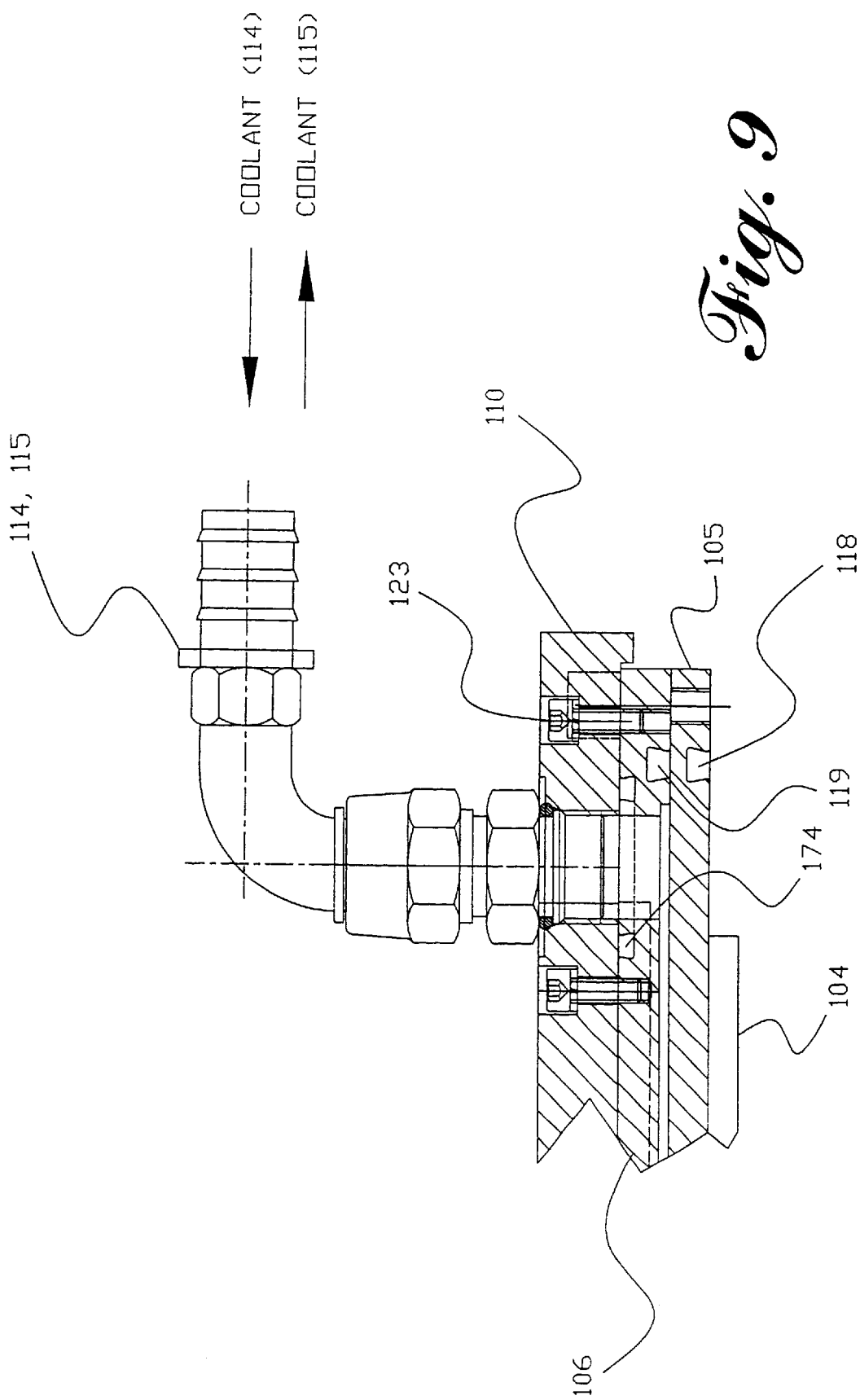
FIG. 9 is a detailed cross-sectional view of a cooling fluid inlet/outlet port of a target assembly according to the embodiment shown in FIG. 3.

FIG. 9 is a detailed cross-sectional view of a cooling fluid inlet/outlet port of a target assembly according to the embodiment shown in FIG. 3. FIG. 9 shows the insulation cover 110, over the heat exchanger/pressure relieving plate 106 which in turn is over the target backing plate 105 and target 104. The target backing plate 105 has an O-ring groove 118. The first side of the heat exchanger/pressure relieving plate 106 has an O-ring groove 119 and the second side of the heat exchanger/pressure relieving plate 106 has an O-ring groove 174 for sealing a seam of inlet and outlet coolant openings fed by hydraulic fittings 114, 115 respectively. The insulation cover 110 is also secured to the heat exchanger/pressure relieving plate 106 has an O-ring groove 120 by fasteners 123.

Figure 10:
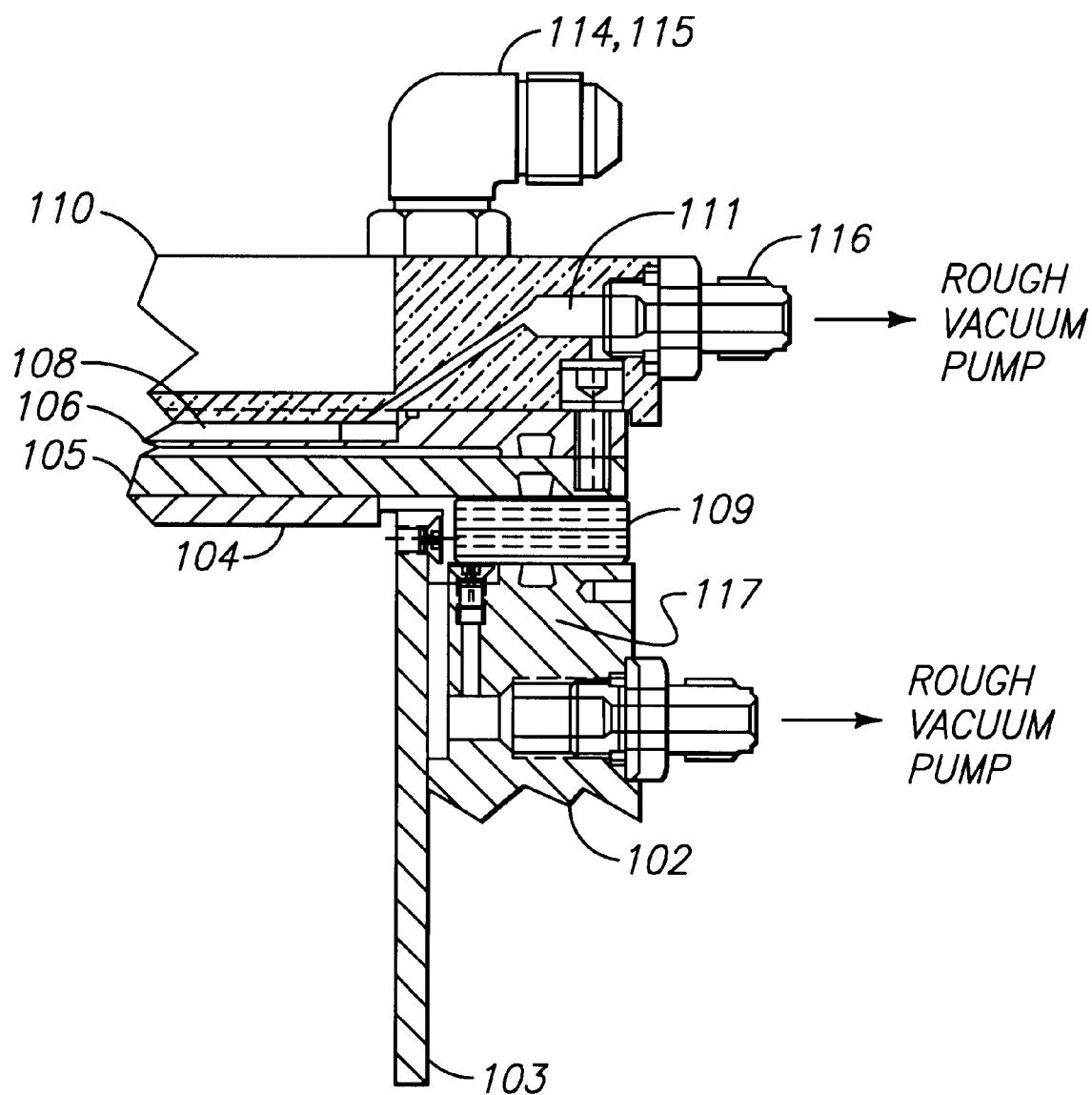
FIG. 10 is a detailed cross-sectional view of a rough vacuum port connecting to the internal passages of a target assembly according to the embodiment shown in FIG. 3.

FIG. 10 is an enlarged view of a portion of FIG. 3 showing a detailed cross-sectional view of one of the drilled openings 111 for the rough vacuum port 116 connecting to the internal passages of the target assembly.

Figure 11:
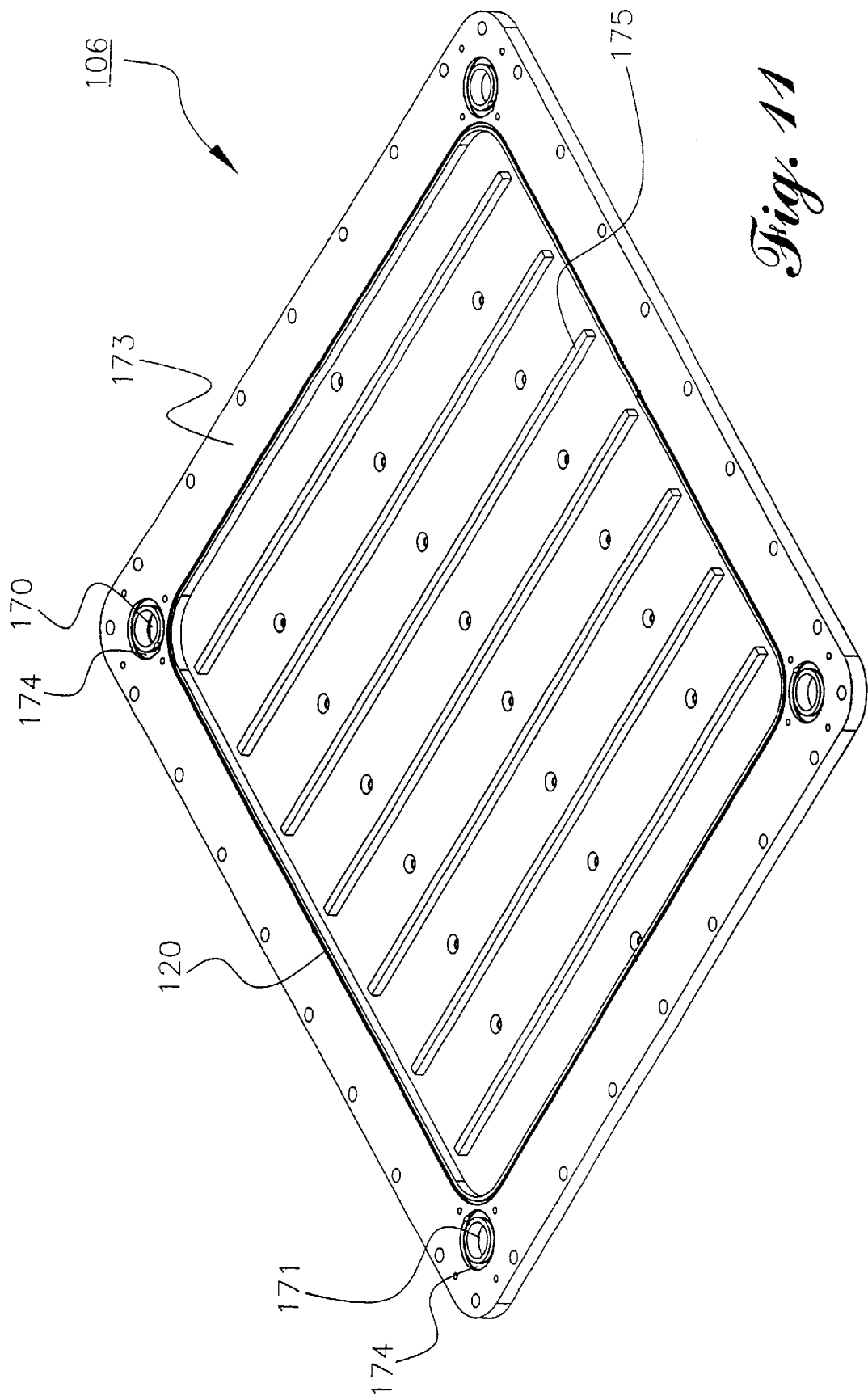
FIG. 11 is a perspective view of a second side of the heat exchanger/pressure relief plate of FIGS. 6A–6C.

FIG. 11 is a bottom perspective view of the heat exchanger/pressure relief plate of FIGS. 6A–6C, showing fins 175 and cavities.

Figure 12:
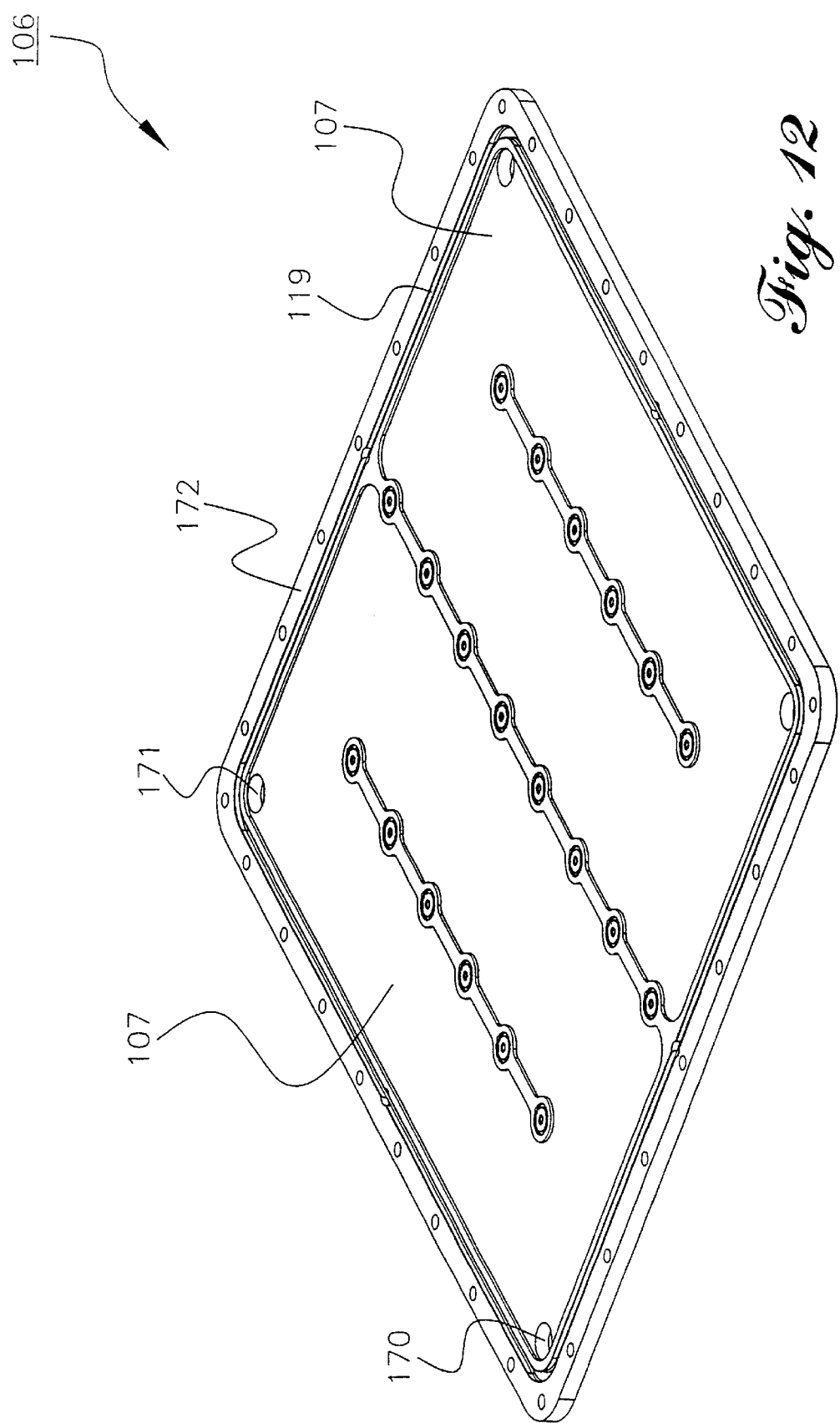
FIG. 12 is a perspective view of a first side of the heat exchanger/pressure relief plate of FIGS. 6A–6C.

FIG. 12 is a top perspective view of the heat exchanger/pressure relief plate of FIGS. 6A–6C.

FIG. 13 shows a simplified schematic diagram of a side cross section of the first embodiment of the present invention taken along the transverse line 13—13 shown in FIG. 6A.

FIG. 14 shows a simplified schematic diagram of a side cross section of a second embodiment of the present invention. This embodiment is the same as the first embodiment except that, cooling fluid cavities 207 and fins 207A are provided on a side 272 of a target backing plate 205, and fins 275 and vacuum cavities between the fins 275 are provided on an insulation cover 210. Therefore, the heat exchanger/pressure relieving plate 206 can be manufactured as a flat sheet-metal piece secured between the backing plate 205 and insulation cover 210. However, for example, when solder bonding, a non-grooved backing plate is generally preferred, in particular for ease of inspecting the solder-bonded joint.

FIG. 15 shows a simplified schematic diagram of a side cross section of a third embodiment of the present invention. This embodiment is the same as the first embodiment except that, cooling fluid cavities are provided as channels 307A drilled in respective straight paths completely through a heat exchanger/pressure relieving plate 306. An appropriate header or other feeding system (not shown) may be provided to feed and remove heat exchange fluid from these channels 307A. For example, the channels 307A may have threaded ends for fittings to communicate with a heat exchange fluid feed system. Of course, rather than a straight path other channel paths, e.g., curved or V-shapes, may be employed. Fins 375 are provided on a side 373 of the heat exchanger/pressure relieving plate 306 to, together with an insulation cover 310, define vacuum cavities. Also, the target backing plate 305 and target 304 are located below the heat exchanger/pressure relieving plate 306. Therefore, the heat exchanger/pressure relieving plate 306 can be secured between the backing plate 305 and the insulation cover 310.

FIG. 16 shows a simplified schematic diagram of a side cross section of a fourth embodiment of the present invention. This embodiment is the same as the first embodiment except that, cooling fluid cavities are provided as channels 407 drilled in respective straight paths completely through a target backing plate 405. An appropriate header or other feeding system (not shown) may be provided to feed and remove heat exchange fluid from these channels 407. Of course, rather than a straight path other channel paths, e.g., curved or V-shapes, may be employed. Fins 475 are provided on a side 473 of the heat exchanger/pressure relieving plate 406 to, together with an insulation cover 410, define vacuum cavities. Also, the target backing plate 405 and target 404 are located below the heat exchanger/pressure relieving plate 406. Therefore, the heat exchanger/pressure relieving plate 406 can be secured between the backing plate 405 and the insulation cover 410.

FIG. 17 shows a simplified schematic diagram of a transverse cross section of a fifth embodiment of the present invention. This embodiment is the same as the first embodiment except that the target and target backing plate 505 is a single monolithic structure rather than a target attached to a backing plate. Thus, cooling fluid cavities 507 and fins 507A are provided on a side 572 of a heat exchanger/pressure relieving plate 506 and fins 575 are provided on an opposed side 573 of the heat exchanger/pressure relieving plate 506 to, together with an insulation cover 510, define vacuum cavities. The heat exchanger/pressure relieving plate 506 is located between the insulation cover 510 and the monolithic target backing plate and target 505. Therefore, the heat exchanger/pressure relieving plate 506 can be secured between the monolithic target backing plate and target 505 and insulation cover 510.

Figure 18:
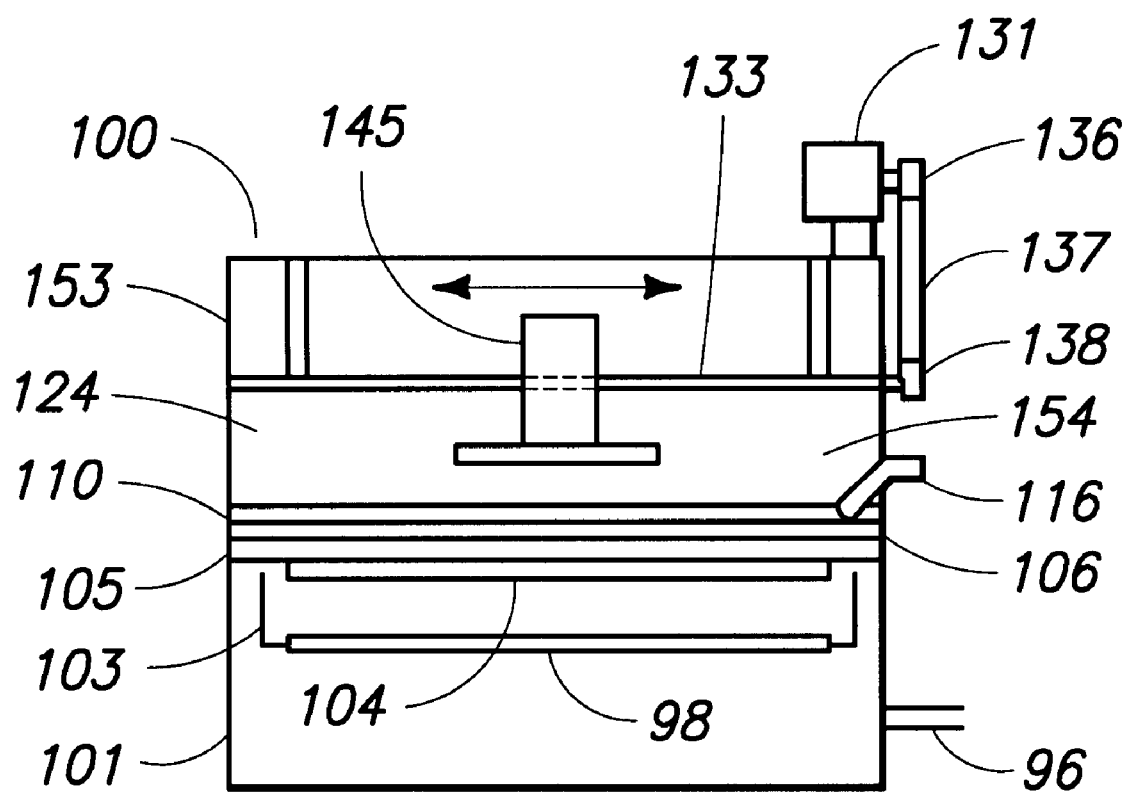
FIG. 18 is a schematic side cross-sectional view of a magnetron apparatus employing the target assembly and magnetron assembly of FIG. 3 taken parallel to the motion of the magnetron.

FIG. 18 is a schematic side cross-sectional view of a sputtering apparatus 100 employing the target assembly 154 and magnetron assembly 124 of FIG. 3. FIG. 18 also shows a substrate 98 that receives sputtered material from the target 104. The substrate 98 is located in the process chamber 101 kept under vacuum drawn by a port 96 connected to a vacuum means (not shown). The target assembly 154 seals an upper portion of the process chamber 101. The magnetron housing 153 is located above the target assembly 154. The magnetron housing 153 may be under vacuum or at ambient pressure. The magnetron housing 153 may be clamped (by removable clamps) to the target assembly 154 with an O-ring therebetween or bolted or other wise attached to be part of the sputtering apparatus. When the magnetron housing 153 is to operate at vacuum pressure, the magnetron housing 153 is attached to the target assembly 154 to form a seal. However, when the magnetron housing 153 is to operate at ambient pressure, it is not necessary to attach the magnetron chamber to the target assembly 154 to form a seal. When the magnetron housing 153 is to operate at ambient pressure, the magnetron housing 153 may be attached to the target assembly 154 with or without forming a seal therebetween, or the magnetron housing 153 may simply be placed over the target assembly 154.

While the invention has been described with regard to specific embodiments, those skilled in the art will recognize that changes can be made in form and detail without departing from the spirit and scope of the invention. For example, the evaluations described here are merely representative of the invention and should not be considered to limit the scope of the invention to the method or structure herein described.

We claim:

1. A magnetron sputtering apparatus comprising:

a housing, at least one magnetron within the housing;

a substrate;

a sputtering processing chamber having a top flange, the flange having a shape and perimeter according to a predetermined form, the substrate being within the sputtering process chamber;

a sputtering target assembly sealed to and insulated from the flange, such that a vacuum is capable of being maintained in the sputtering process chamber;

wherein the sputtering target assembly comprises:

a sputtering target and target backing plate assembly having opposed first and second sides, the first side providing material for sputtering, a pressure relief plate having opposed first and second sides, the target and target backing plate assembly second side being in contact with the first side of the pressure relief plate, heat exchange passages selected from at least one member of the group consisting of:

heat exchange passages defined between the opposed sides of the sputtering target and backing plate assembly, heat exchange passages defined between the opposed sides of the pressure relief plate, and heat exchange passages defined by heat exchange cavities formed in at least one member of the group consisting of the first side of the pressure relief plate and the second side of the target and target backing plate assembly, wherein the heat exchange passages are formed between the first side of the pressure relief plate and the second side of the target and target backing plate assembly which enclose the heat exchange cavities, the heat exchange passages having one or more inlet and outlet openings, an insulation cover unit having opposed first and second sides, wherein the insulation cover unit is electrically isolated from the sputtering target;

wherein the second side of the pressure relief plate is in contact with the first side of the cover unit to form at least one vacuum pressure space therebetween capable of maintaining a vacuum therein and the at least one vacuum pressure space having at least one vacuum port;

wherein the pressure in the sputtering processing chamber is vacuum pressure which is the same or different from the pressure in the at least one vacuum pressure space;

wherein every magnetron of the magnetron sputtering apparatus is outside the at least one vacuum pressure space of the sputtering target assembly.

2. The magnetron sputtering apparatus of claim 1, wherein the heat exchange passages are selected from at least one member of the group consisting of(a)
   (a) heat exchange passages defined within the sputtering target and backing plate assembly,
   (b) heat exchange passages defined by having heat exchange cavities formed in the first side of the pressure relief plate such that, when the first side of the pressure relief plate is contacted to the second side of the target and target backing plate assembly, the heat exchange passages are formed between the heat exchange cavities in the pressure relief plate and the target and target backing plate assembly enclosing those heat exchange cavities, and
   (c) heat exchange passages defined by having heat exchange cavities formed in the second side of the target and target backing plate assembly such that, when the first side of the pressure relief plate is contacted to the second side of the target and target backing plate assembly, the heat exchange passages are formed between the heat exchange cavities in the target and target backing plate assembly and the pressure relief plate enclosing those heat exchange cavities.

3. The magnetron sputtering apparatus of claim 1, wherein the at least one vacuum pressure space is defined by vacuum passages capable of maintaining a vacuum and having at least one vacuum port, the vacuum passages selected from at least one member of the group consisting of:
   (a) vacuum passages defined by having vacuum cavities formed in the second side of the pressure relief plate such that, when the first side of the insulation cover unit is contacted to the second side of the pressure relief plate, the vacuum passages are formed between the vacuum cavities in the pressure relief plate and the insulation cover unit enclosing those vacuum cavities, and
   (b) vacuum passages defined by having vacuum cavities formed in the first side of the insulation cover unit such that, when the second side of the pressure relief plate is contacted to the first side of the insulation cover unit, the vacuum passages are formed between the vacuum cavities in the insulation cover unit and the pressure relief plate enclosing those vacuum cavities.

4. The magnetron sputtering apparatus as in claim 1, wherein the heat exchange passages are defined within the sputtering target and target backing plate assembly to have channels having a perimeter, transverse to a direction for flow of heat exchange fluid, entirely defined by the sputtering target and target backing plate assembly.

5. The magnetron sputtering apparatus as in claim 1, wherein the heat exchange passages are defined by having heat exchange cavities formed in the first side of the pressure relief plate such that, when the first side of the pressure relief plate is contacted to the second side of the target and target backing plate assembly, the heat exchange passages are formed between the heat exchange cavities in the pressure relief plate and the target and target backing plate assembly enclosing those heat exchange cavities.

6. The magnetron sputtering apparatus as in claim 5, wherein the second side of the target and target backing plate assembly is generally flat.

7. The magnetron sputtering apparatus as in claim 1, wherein the heat exchange passages are defined by having heat exchange cavities formed in the second side of the target and target backing plate assembly such that, when the first side of the pressure relief plate is contacted to the second side of the target and target backing plate assembly, the heat exchange passages are formed between the heat exchange cavities in the target and target backing plate assembly and the pressure relief plate enclosing those heat exchange cavities.

8. The magnetron sputtering apparatus as in claim 7, wherein the first side of the pressure relief plate is generally flat.

9. The magnetron sputtering apparatus as in claim 1, wherein the at least one vacuum pressure space comprises vacuum passages defined by having vacuum cavities formed in the second side of the pressure relief plate such that, when the first side of the insulation cover unit is contacted to the second side of the pressure relief plate, the vacuum passages are formed between the vacuum cavities in the pressure relief plate and the insulation cover unit enclosing those vacuum cavities.

10. The magnetron sputtering apparatus as in claim 9, wherein the first side of the insulation cover unit is generally flat.

11. The magnetron sputtering apparatus as in claim 1, wherein the at least one vacuum pressure space comprises vacuum passages defined by having vacuum cavities formed in the first side of the insulation cover unit such that, when the second side of the pressure relief plate is contacted to the first side of the insulation cover unit, the vacuum passages are formed between the vacuum cavities in the insulation cover unit and the pressure relief plate enclosing those vacuum cavities.

12. The magnetron sputtering apparatus as in claim 11, wherein the second side of the pressure relief plate is generally flat.

13. The magnetron sputtering apparatus of claim 1, wherein the sputtering target and target backing plate assembly comprises a sputtering target having opposed first and second sides and a target backing plate assembly having opposed first and second sides;
   the sputtering target second side is in contact with the first side of the target backing plate assembly; and
   the target backing plate assembly second side is in contact with the first side of the pressure relief plate.

14. The magnetron sputtering apparatus as in claim 1, wherein the sputtering target and target backing plate assembly is a monolith of a material.

15. The magnetron sputtering apparatus as in claim 1, wherein the target backing plate assembly is configured to cover a top opening of the sputtering process chamber to seal the top opening, and wherein a magnet of the magnetron operates at ambient pressure while maintaining a vacuum pressure in the at least one vacuum pressure space.

16. The magnetron sputtering apparatus as in claim 1, wherein the housing comprises a top chamber in which the at least one magnetron is located, wherein the target backing plate assembly is configured to cover a bottom opening of the top chamber of the housing to seal the bottom, and such that a magnet of the at least one magnetron is capable of operating at ambient pressure while maintaining a vacuum pressure in the at least one vacuum pressure space.

17. The magnetron sputtering apparatus as in claim 1, wherein the heat exchange passages run parallel to one another and are configured to distribute a fluid flow approximately equally between them when they receive the flow from an inlet manifold area.

18. The magnetron sputtering apparatus as in claim 1, wherein the heat exchange passages run adjacent to one another and are configured to distribute a fluid flow to maintain a generally uniform temperature across a surface of the sputtering target and target backing plate assembly.

19. The sputtering apparatus as in claim 1, wherein the sputtering target assembly is configured to cover a bottom opening of a top chamber to seal the bottom opening such that a vacuum chamber beneath the bottom opening is capable of operating at a vacuum pressure while the top chamber operates at ambient pressure, and while a vacuum pressure is maintained in the at least one vacuum pressure space, wherein the pressure in the vacuum chamber is the same or different from the pressure in the at least one vacuum pressure space.

20. The sputtering apparatus as in claim 1, wherein the sputtering target assembly sealed to and insulated from the flange defines a vacuum passage to a vacuum system from the vacuum pressure space.

21. A scanning magnetron sputtering apparatus comprising:
   a magnetron assembly comprising a movable magnetron;
   a magnetron housing comprising a top chamber for locating the magnetron therein and a sputtering process chamber for locating a substrate therein;
   a sputtering target assembly between the top chamber and the sputtering process chamber, comprising a target surface for providing sputtering material;
   the magnetron assembly comprising:
      the movable magnetron,
      a magnetron lift base plate mounted to the magnetron housing,
      springs compressed between the magnetron lift base plate and the magnetron housing, wherein the magnetron lift base plate presses against the springs,
      the magnetron being functionally attached to the magnetron lift base plate, and connected to a drive shaft to control motion of the magnetron;
      rotatable cam shafts mounted within the housing, and a gear for controlling rotation of the cam shafts to control distance between the magnetron and the target surface for providing sputtering material, wherein the cam shafts contain cams pressing against the magnetron lift base plate such that rotation of the cams moves the magnetron lift base plate transverse to a longitudinal axis of the cam shaft and the magnetron functionally mounted to the magnetron lift base plate is also forced to move transverse along with the magnetron lift base plate to set the distance between the magnetron and the surface of the target.

22. A linear scanning magnetron sputtering apparatus comprising:
   a magnetron assembly comprising a movable magnetron;
   a magnetron housing comprising a top chamber for locating the magnetron therein and a process chamber for locating a substrate therein;
   a sputtering target assembly between the top chamber and the process chamber, comprising a target surface for providing sputtering material;
   the magnetron assembly comprising:
      the movable magnetron, a magnetron base plate secured to the moveable magnetron, at least one slide mount fitted with bearings attached to the magnetron base plate, and slide shafts, wherein the slide mount is mounted to receive the slide shafts,
      a magnetron lift base plate mounted to the magnetron housing, wherein the ends of the slide shafts are mounted to the magnetron lift base plate, wherein the magnetron slides freely on the slide shafts,
      springs compressed between the magnetron lift base plate and the magnetron housing, wherein the magnetron lift base plate presses against the springs,
      a leadscrew nut, a nut mount and a leadscrew having a longitudinal axis generally parallel to the slide shafts, the nut mount being attached to the leadscrew nut, and fitted with bearings so that shafts mounted about the base plate are capable of transmitting push/pull motion of the leadscrew;
      the magnetron being connected to the nut mount such that the magnetron is pushed or pulled axially by motion of the leadscrew nut driven by the leadscrew, the magnetron is also capable of sliding transversally to the axis of the leadscrew;
      rotatable cam shafts mounted within the housing, and a gear for controlling rotation of the cam shafts to control distance between the magnetron and the target surface for providing sputtering material, wherein the cam shafts contain cams pressing against magnetron lift base plate such that rotation of the cams forces the magnetron lift base plate to move transverse to a longitudinal axis of the cam shaft and the magnetron, sliding on slide shafts mounted to the magnetron lift base plate is also forced to move transverse along with the magnetron lift base plate to set the distance between the magnetron and the surface of the target.

23. The linear scanning magnetron sputtering apparatus of claim 22, further comprising a first driver pulley attached to the leadscrew, a motor having a shaft attached to a second driver pulley, and a timing belt, wherein a back and forth rotating motion of the motor shaft is transmitted to the leadscrew by the timing belt.

24. The linear scanning magnetron sputtering apparatus of claim 22, wherein the ends of the slide shafts are mounted to the magnetron lift base plate by being mounted to mounting supports mounted to the magnetron lift base plate, and the mounting supports are rotatable to cause the magnetron to travel rotated by an angle in the range of ±45 degrees from perpendicular to the leadscrew longitudinal axis.

25. The linear scanning magnetron sputtering apparatus of claim 22, further comprising shims for controlling the parallelism of the magnetron with respect to the surface of the target, wherein ends of the cam are supported by cam shaft mounts, wherein the cam shaft mounts and shims are fastened to the magnetron housing.

26. The linear scanning magnetron sputtering apparatus of claim 22, wherein the gear for controlling rotation comprises a respective self-locking worm and worm gear set provided for each cam shaft.

27. A method of sputtering comprising:
   providing a sputtering target assembly comprising:
      a sputtering target and target backing plate assembly having opposed first and second sides, the first side providing material for sputtering,
      a pressure relief plate having opposed first and second sides, the target and target backing plate assembly second side being in contact with the first side of the pressure relief plate;
   heat exchange passages selected from at least one member of the group consisting of:
      heat exchange passages defined between the opposed sides of the sputtering target and backing plate assembly,
      heat exchange passages defined between the opposed sides of the pressure relief plate, and
      beat exchange passages defined by heat exchange cavities formed in at least one member of the group consisting of the first side of the pressure relief plate and the second side of the target and target backing plate assembly, wherein the heat exchange passages are formed between the first side of the pressure relief plate and the second side of the target and target backing plate assembly which enclose the heat exchange cavities, the heat exchange passages having one or more inlet and outlet openings;

an insulation cover unit having opposed first and second sides;

wherein the second side of the pressure relief plate is in contact with the first side of the insulation cover unit to form a vacuum pressure space therebetween and the vacuum pressure space has one or more vacuum ports, sputtering material from the target first surface;

passing cooling medium through the heat exchange passages; and maintaining a vacuum in the vacuum pressure space.

28. The method of claim 27, wherein the heat exchange passages are selected from at least one member of the group consisting of:

(a) heat exchange passages defined within the sputtering target and backing plate assembly, (b) heat exchange passages defined by having heat exchange cavities formed in the first side of the pressure relief plate such that, when the first side of the pressure relief plate is contacted to the second side of the target and target backing plate assembly, the heat exchange passages are formed between the heat exchange cavities in the pressure relief plate and the target and target backing plate assembly enclosing those heat exchange cavities, and (c) heat exchange passages defined by having heat exchange cavities formed in the second side of the target and target backing plate assembly such that, when the first side of the pressure relief plate is contacted to the second side of the target and target backing plate assembly, the heat exchange passages are formed between the heat exchange cavities in the target and target backing plate assembly and the pressure relief plate enclosing those heat exchange cavities.

29. The method of claim 27, wherein the vacuum pressure space is defined by vacuum passages in which a vacuum is maintained, and the vacuum passages have one or more vacuum ports, the vacuum passages selected from at least one member of the group consisting of:

(a) vacuum passages defined by having vacuum cavities formed in the second side of the pressure relief plate such that, when the first side of the insulation cover unit is contacted to the second side of the pressure relief plate, the vacuum passages are formed between the vacuum cavities in the pressure relief plate and the insulation cover unit enclosing those vacuum cavities, and (b) vacuum passages defined by having vacuum cavities formed in the first side of the insulation cover unit such that, when the second side of the pressure relief plate is contacted to the first side of the insulation cover unit, the vacuum passages are formed between the vacuum cavities in the insulation cover unit and the pressure relief plate enclosing those vacuum cavities.

30. A sputtering apparatus configuration comprising:

a sputtering process chamber, a target assembly, and a magnetron housing and a magnetron drive mechanism;

the sputtering process chamber having a top flange, the flange having a shape and perimeter according to a predetermined form;

the target assembly sealed to and insulated from the flange;

wherein the target assembly comprises a sputtering target having opposed first and second sides, a target backing plate having opposed first and second sides, a heat exchanger/pressure relieving plate having opposed first and second sides, and an insulation cover unit having opposed first and second sides;

wherein the first side of a sputtering target is for being consumed by sputtering action in the sputtering process chamber;

wherein the second side of the sputtering target is in intimate contact to the first side of the target backing plate;

wherein a set of cooling cavities and fins are disposed in the first side of the heat exchanger/pressure relieving plate;

wherein the first side of the heat exchanger/pressure relieving plate is in intimate contact to the second side of the target backing plate;

wherein another set of cavities and fins are disposed in the second side of the heat exchanger/pressure relieving plate;

wherein the second side of the heat exchanger/pressure relieving plate is in intimate contact to the first side of the insulation cover unit to form a pressure relieving space.

31. A sputtering apparatus assembly comprising:

a sputtering process chamber, a target assembly, a magnetron, and a magnetron housing and a magnetron drive mechanism;

the sputtering process chamber comprising a top flange, the flange having a shape and perimeter according to a predetermined form;

the target assembly sealed to and insulated from the flange;

the magnetron generally enclosed by the magnetron housing, and movable or scanable over the target assembly by the magnetron drive mechanism;

wherein the target assembly comprises a sputtering target having first and second opposed sides, a target backing plate having first and second opposed sides, a heat exchanger/pressure relieving plate having first and second opposed sides, and an insulation cover unit having first and second opposed sides;

wherein the magnetron is movable or scanable in close proximity to the second side of insulation cover, on the target assembly, using the magnetron drive mechanism;

wherein the distance between the magnetron and the second side of insulation cover unit is adjustable throughout the useful life of the target without adversely affecting vacuum integrity in the sputtering process chamber.

* * * * *

UNITED STATES PATENT AND TRADEMARK OFFICE
CERTIFICATE OF CORRECTION

PATENT NO. : 6,494,999 B1  Page 1 of 1
DATED : December 17, 2002
INVENTOR(S) : Manuel J. Herrera et al.

It is certified that error appears in the above-identified patent and that said Letters Patent is hereby corrected as shown below:

Column 1,
Line 59, please replace "PVD processes assert they can confornally cover" with -- PVD processes assert they can conformally cover --

Column 3,
Line 44, please replace "assembly 8 is-located on the lower" with -- assembly 8 is located on the lower --

Column 11,
Line 4, please replace "intensity causes one comer of the target" with -- intensity causes one corner of the target --

Column 14,
Line 33, please replace "bum-in period for a variety of carefully" with -- burn-in period for a variety of carefully --

Column 21,
Line 3, please replace "member of the group consisting of (a)" with -- member of the group consisting of (a): --

Column 24,
Line 65, please replace "beat exchange passages defined by heat exchange" with -- heat exchange passages defined by heat exchange --

Signed and Sealed this

Thirteenth Day of May, 2003

JAMES E. ROGAN
*Director of the United States Patent and Trademark Office*

UNITED STATES PATENT AND TRADEMARK OFFICE
CERTIFICATE OF CORRECTION

PATENT NO.    : 6,494,999 B1
DATED         : December 17, 2002
INVENTOR(S)   : Manuel J. Herrera et al.

It is certified that error appears in the above-identified patent and that said Letters Patent is hereby corrected as shown below:

Column 1,
Line 59, please replace "PVD processes assert they can confornally cover" with -- PVD processes assert they can conformally cover --

Column 3,
Line 44, please replace "assembly 8 is-located on the lower" with -- assembly 8 is located on the lower --

Column 11,
Line 4, please replace "intensity causes one comer of the target" with -- intensity causes one corner of the target --

Column 14,
Line 33, please replace "bum-in period for a variety of carefully" with -- burn-in period for a variety of carefully --

Column 21,
Line 3, please replace "member of the group consisting of (a)" with -- member of the group consisting of: --

Column 24,
Line 65, please replace "beat exchange passages defined by heat exchange" with -- heat exchange passages defined by heat exchange --

This certificate supersedes Certificate of Correction issued May 13, 2003

Signed and Sealed this

Eighteenth Day of November, 2003

JAMES E. ROGAN
*Director of the United States Patent and Trademark Office*